US012635131B2

(12) United States Patent
Chang et al.

(10) Patent No.: US 12,635,131 B2
(45) Date of Patent: *May 19, 2026

(54) FILM-BASED ONE-TIME-PROGRAMMABLE MEMORY CELLS IN DEVICE METALLIZATION LAYERS AND BACK-END OF LINE METHODS OF MANUFACTURING THEREOF

(71) Applicant: Taiwan Semiconductor Manufacturing Company, Ltd., Hsinchu (TW)

(72) Inventors: Meng-Sheng Chang, Hsinchu (TW); Chia-En Huang, Hsinchu (TW); Yih Wang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 113 days.

This patent is subject to a terminal disclaimer.

(21) Appl. No.: 18/405,929

(22) Filed: Jan. 5, 2024

(65) Prior Publication Data

US 2025/0105173 A1 Mar. 27, 2025

Related U.S. Application Data

(60) Provisional application No. 63/584,220, filed on Sep. 21, 2023.

(51) Int. Cl.
*H10B 20/25* (2023.01)
*G11C 17/16* (2006.01)
(Continued)

(52) U.S. Cl.
CPC ............. *H10B 20/25* (2023.02); *G11C 17/16* (2013.01); *G11C 17/18* (2013.01); *H10W 42/40* (2026.01)

(58) Field of Classification Search
CPC ........ H10B 20/25; H10B 20/00; H10B 20/20; G11C 17/16; G11C 17/18; G11C 7/12;
(Continued)

(56) References Cited

U.S. PATENT DOCUMENTS

| | | | | |
|---|---|---|---|---|
| 7,609,539 B2 * | 10/2009 | Peng | ....................... | G11C 17/18 |
| | | | | 365/96 |
| 10,153,288 B2 * | 12/2018 | Chang | .................... | H10B 20/25 |

(Continued)

FOREIGN PATENT DOCUMENTS

| | | | | |
|---|---|---|---|---|
| EP | 3196889 A1 * | 7/2017 | ............... | G11C 7/24 |
| EP | 3926634 B1 * | 6/2024 | ............. | G11C 17/06 |

(Continued)

OTHER PUBLICATIONS

Cho et al. "Fabrication and Operation Methods of a One-time Programmable (OTP) Nonvolatile Memory (NVM) Based on a Metal-oxide-semiconductor Structure". Journal of the Korean Physical Society, 2011; 58:1488-1493. (Year: 2011).*

(Continued)

*Primary Examiner* — B. James Peikari
(74) *Attorney, Agent, or Firm* — Foley & Lardner LLP

(57) ABSTRACT

A memory device includes an array having a plurality of one-time-programmable (OTP) memory cells on a side of a substrate, a plurality of word lines (WLs), a plurality of bit lines (BLs), and a plurality of control gate (CG) lines. Each of the OTP memory cells includes a first fuse resistor, a second fuse resistor, a first transistor, and a second transistor. The first and the second fuse resistors are connected to a corresponding one of the BLs, while the first and the second transistors are respectively gated by a first one and a second one of the CG lines. The first transistor, the second transistor, the first fuse resistor, and the second fuse resistor are respectively formed in a first one, a second one, a third one, (Continued)

and a fourth one of a plurality of metallization layers disposed on the side of the substrate.

20 Claims, 15 Drawing Sheets

(51) Int. Cl.
*G11C 17/18* (2006.01)
*H10W 42/40* (2026.01)

(58) Field of Classification Search
CPC .. H01L 23/5256; H01L 23/528; H01L 23/573
See application file for complete search history.

(56) References Cited

U.S. PATENT DOCUMENTS

| | | | | |
|---|---|---|---|---|
| 11,094,387 B2 * | 8/2021 | Chang | | G11C 17/18 |
| 11,145,344 B1 * | 10/2021 | Lu | | G11C 17/16 |
| 11,729,997 B2 * | 8/2023 | Lin | | H10D 84/0149 |
| 2012/0057423 A1 * | 3/2012 | Chen | | G11C 17/165 |
| | | | | 365/225.7 |
| 2016/0013193 A1 * | 1/2016 | Wu | | G11C 17/04 |
| | | | | 365/96 |
| 2018/0102909 A1 * | 4/2018 | Wu | | H04L 9/3278 |
| 2020/0219575 A1 * | 7/2020 | Ha | | G11C 29/787 |
| 2020/0365222 A1 * | 11/2020 | Lee | | G11C 17/18 |
| 2021/0272971 A1 * | 9/2021 | Li | | H10B 20/25 |
| 2021/0313337 A1 * | 10/2021 | Chang | | H10B 20/25 |
| 2022/0020706 A1 * | 1/2022 | Plouchart | | H01L 23/573 |
| 2022/0084611 A1 * | 3/2022 | Wang | | G11C 11/4094 |
| 2022/0367490 A1 * | 11/2022 | Chang | | H10B 20/25 |
| 2022/0385486 A1 * | 12/2022 | Chung | | G11C 17/16 |
| 2023/0058880 A1 * | 2/2023 | Chang | | H10B 20/20 |
| 2023/0162772 A1 * | 5/2023 | Chao | | G11C 17/16 |
| | | | | 365/96 |
| 2023/0360711 A1 * | 11/2023 | Chang | | G11C 13/004 |
| 2023/0363151 A1 * | 11/2023 | Chang | | H01L 23/5252 |
| 2025/0062251 A1 * | 2/2025 | Chang | | H10B 20/25 |

FOREIGN PATENT DOCUMENTS

| | | |
|---|---|---|
| KR | 10-2006-0086756 A | 8/2006 |
| KR | 10-2018-0085120 A | 7/2018 |
| KR | 10-2021-0151665 A | 12/2021 |
| TW | I610309 B | 1/2018 |
| TW | I799240 B | 4/2023 |

OTHER PUBLICATIONS

Office Action issued in connection with Taiwan Appl. No. 113111310 dated Nov. 22, 2024.
Office Action issued in Korean Appl. No. 10-2024-0126926 dated May 21, 2025.

* cited by examiner

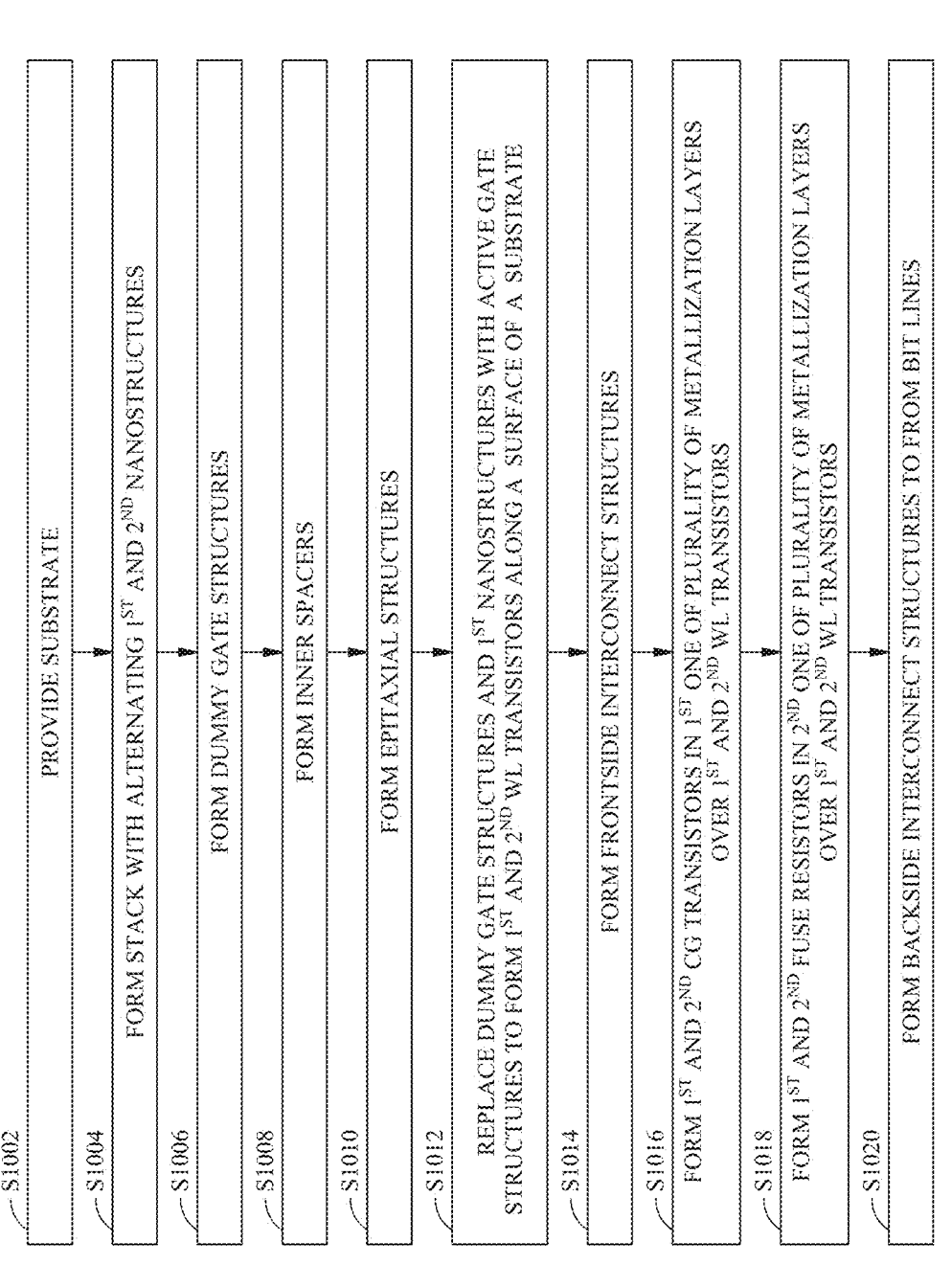

1000

S1002 PROVIDE SUBSTRATE

S1004 FORM STACK WITH ALTERNATING 1ST AND 2ND NANOSTRUCTURES

S1006 FORM DUMMY GATE STRUCTURES

S1008 FORM INNER SPACERS

S1010 FORM EPITAXIAL STRUCTURES

S1012 REPLACE DUMMY GATE STRUCTURES AND 1ST NANOSTRUCTURES WITH ACTIVE GATE STRUCTURES TO FORM 1ST AND 2ND WL TRANSISTORS ALONG A SURFACE OF A SUBSTRATE

S1014 FORM FRONTSIDE INTERCONNECT STRUCTURES

S1016 FORM 1ST AND 2ND CG TRANSISTORS IN 1ST ONE OF PLURALITY OF METALLIZATION LAYERS OVER 1ST AND 2ND WL TRANSISTORS

S1018 FORM 1ST AND 2ND FUSE RESISTORS IN 2ND ONE OF PLURALITY OF METALLIZATION LAYERS OVER 1ST AND 2ND WL TRANSISTORS

S1020 FORM BACKSIDE INTERCONNECT STRUCTURES TO FROM BIT LINES

FIG. 10

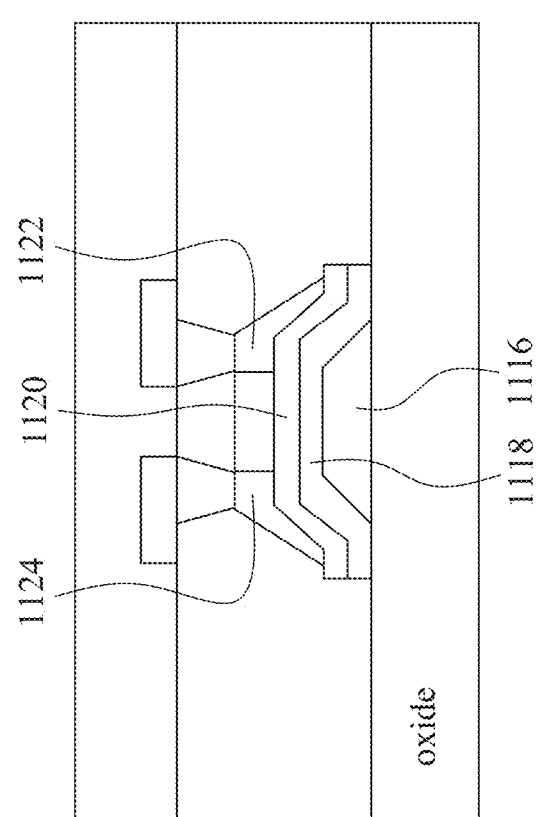
1122
1120
1124
1118 1116
oxide
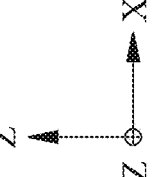
FIG. 11

FILM-BASED ONE-TIME-PROGRAMMABLE MEMORY CELLS IN DEVICE METALLIZATION LAYERS AND BACK-END OF LINE METHODS OF MANUFACTURING THEREOF

CROSS-REFERENCE TO RELATED APPLICATION

This application claims priority to and the benefit of U.S. Provisional Application No. 63/584,220, filed Sep. 21, 2023, entitled "A PUF STRUCTURE ON METAL FUSE WITH BEOL TRANSISTOR," which is incorporated herein by reference in its entirety for all purposes.

BACKGROUND

A one-time-programmable (OTP) memory device is one type of non-volatile memory device utilized in integrated circuits for adjusting the circuitry after fabrication of an integrated circuit. For example, the OTP memory device is used for providing repair information that controls the usage of redundant cells in replacing defective cells of a memory array. Another use is for tuning analog circuitry by trimming a capacitive or resistive value of an analog circuit or enabling and disabling portions of the system. In different fabrication facilities, the same product may be manufactured using common production technologies. However, despite best engineering efforts, it is likely that each facility will produce a slightly different product. Usage of OTP memory devices allows independent optimization of the product functionality for each manufacturing facility.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 10 illustrates a flow chart of an example method for fabricating a semiconductor device in accordance with some embodiments.

FIG. 11 illustrates an example diagram of a thin film transistor implemented as a CG transistor in accordance with some embodiments.

DETAILED DESCRIPTION

Figure 1:
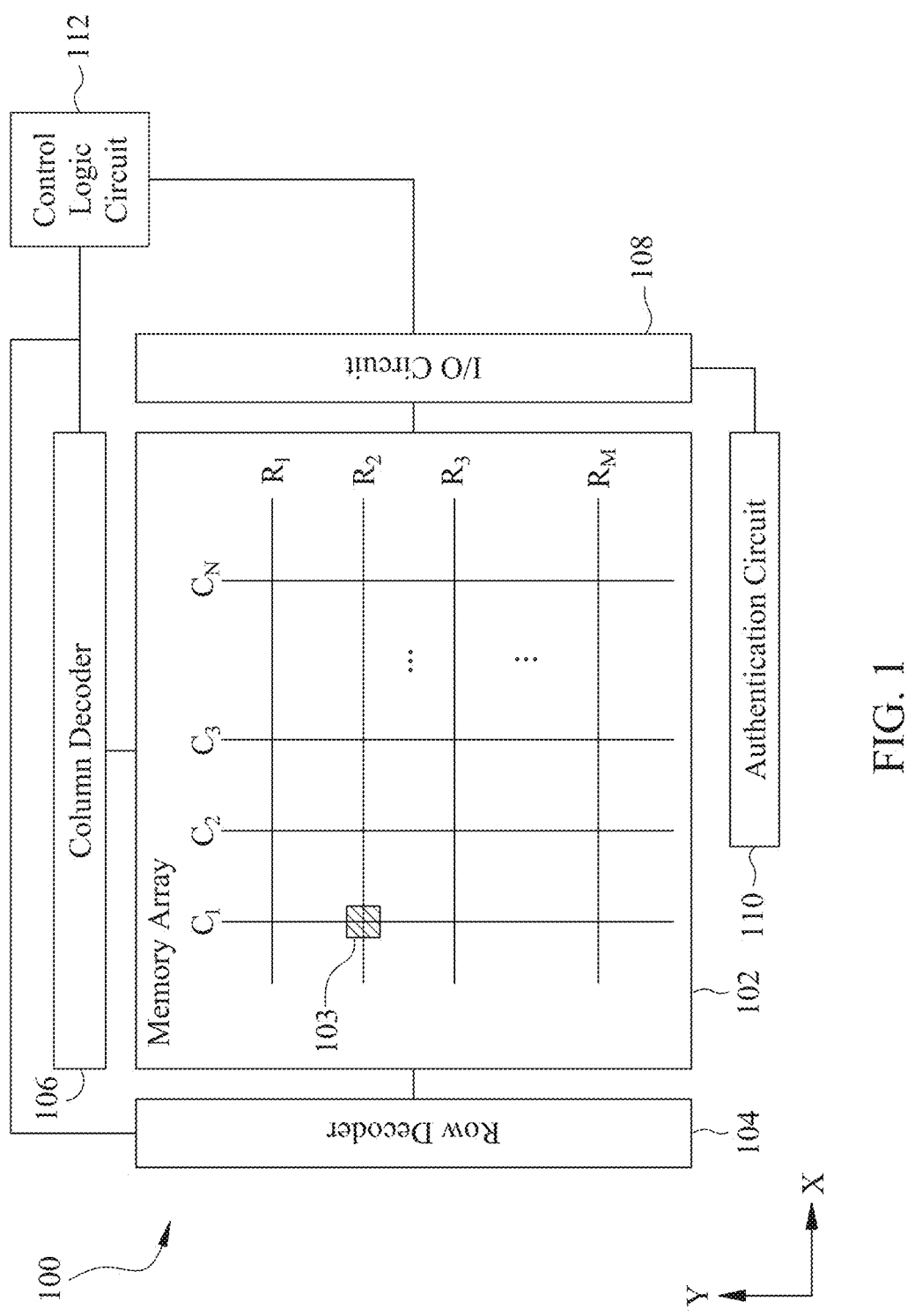
FIG. 1 illustrates a block diagram of an example memory system including a memory array in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A physically unclonable function (PUF) is generally used for authentication and secret key storage without requiring secure electrically erasable programmable read-only memory (EEPROMs) and/or other expensive hardware (e.g., battery-backed static random-access memory). Instead of storing secrets in a digital memory, the PUF derives a secret from the unique physical characteristics of an integrated circuit (IC). The PUF is based on an idea that even though an identical manufacturing process is used to fabricate a number of ICs, each IC may be slightly different from one another due to manufacturing variability. PUFs leverage this variability to derive "secret" information that is unique to each of the ICs (e.g., a silicon biometric). Generally, such secret information is referred to as a "PUF signature" of the IC. In addition, due to the manufacturing variability that defines the PUF signature, one cannot manufacture two identical ICs even with full knowledge of the IC's design. Various types of variability of an IC can be used to define such a signature such as, for example, gate delay(s), power-on state(s) of a memory device, and/or any of a variety of physical characteristics of an IC.

Embodiments of the present disclosure provide various systems and methods to generate, at least a bit of a PUF signature (referred to as a PUF bit) for/from a memory device including a number of memory cells. In one aspect of the present disclosure, each of the memory cells is implemented as an efuse cell that includes multiple transistors and two fuse resistors (referred to as "mT2R structure"). The two fuse resistors each have one end commonly connected to a bit line, through which a programming voltage is applied. Even though the two fuse resistors are formed in the same dimensions and the same material, while being concurrently programed with the same level of a programming voltage, it is likely that a first fuse resistor will be blown (or burned) before the second fuse resistor, leaving the second fuse resistor intact, according to various embodiments. As such, one of the two fuse resistors can be randomly (and preced-ingly) programmed to equivalently form an open circuit, while the other remains intact as a short circuit. According to which of the fuse resistors is broken down first, the disclosed system (e.g., integrated with the memory device) can generate a PUF bit for/from a memory cell of the memory device. Applying the same principle over all of the memory cells, the disclosed system can generate a unique PUF signature for/from the memory device.

In some embodiments, a memory device includes an array including a plurality of one-time-programmable (OTP) memory cells formed on one side (e.g., frontside) of a substrate, a plurality of word lines (WLs), a plurality of bit lines (BLs), and a plurality of control gate (CG) lines. Each of the OTP memory cells includes a first fuse resistor, a second fuse resistor, a first transistor, and a second transistor. The first fuse resistor and the second fuse resistor are commonly connected to a corresponding one of the BLs, while the first transistor and the second transistor are gated by a first one and a second one of the CG lines, respectively. The first transistor, the second transistor, the first fuse resistor, and the second fuse resistor are formed in a first one, a second one, a third one, and a fourth one of a plurality of metallization layers respectively disposed on the side of the substrate, and thus the first and the second fuse resistors, and the first and the second transistors are formed in the back end of line (BEOL), thus leads to reduced memory cell area and increased memory cell density in the memory device.

FIG. 1 illustrates a block diagram of a memory system 100, in accordance with various embodiments. In the illus-trated embodiment of FIG. 1, the memory system 100 includes a memory array 102, a row decoder 104, a column decoder 106, an input/output (I/O) circuit 108, an authenti-cation circuit 110, and a control logic circuit 112. Despite not being shown in FIG. 1, all of the components of the memory system 100 may be coupled to each other and to the control logic circuit 112. Although, in the illustrated embodiment of FIG. 1, each component is shown as a separate block for the purpose of clear illustration, in some other embodiments, some or all of the components shown in FIG. 1 may be integrated together. For example, the memory array 102 may include an embedded authentication circuit (e.g., 110).

The memory array 102 is a hardware component that stores data. In various embodiments, the memory array 102 is embodied as a semiconductor memory device. The memory array 102 includes a plurality of memory cells (or otherwise storage units) 103. The memory array 102 includes a number of rows $R_1$, $R_2$, $R_3$ . . . . $R_M$, each extending in a first direction (e.g., X-direction) and a number of columns $C_1$, $C_2$, $C_3$ . . . . $C_N$, each extending in a second direction (e.g., Y-direction). Each of the rows and columns may include one or more conductive (e.g., metal) structures which function as access lines. Each memory cell 103 is arranged in the intersection of a corresponding row and a corresponding column, and can be operated according to voltages or currents through the respective conductive struc-tures of the column and row. For example, each of the rows may include a corresponding word line (WL), and each of the columns may include a corresponding bit line (BL) and multiple corresponding control gate (CG) lines.

In some embodiments, each memory cell 103 is embodied as an efuse memory cell that may include a first fuse resistor, a second fuse resistor, a first control/cascode gate (CG) selector/transistor, a second CG selector/transistor, and one or more WL selectors/transistors. The first fuse resistor, the first CG transistor, and at least one of the WL transistors are coupled to each other in series, and the second fuse resistor, the second CG transistor, and at least one of the WL transistors are coupled to each other in series. Further, a corresponding WL can be connected to respective one or more gates of the one or more WL transistors, a correspond-ing BL can be connected to respective ends of the first and second fuse resistors, a corresponding first CG line can be connected to a gate of the first CG transistor, and a corre-sponding second CG line can be connected to a gate of the second CG transistor, which will be discussed in further detail with respect to FIGS. 2 and 3.

Although, in various embodiments of the present disclo-sure, the memory cell 103 is implemented as an efuse memory cell that includes a number of fuse resistors each formed as a metal track in a corresponding metallization layer, the fuse resistors of the memory cell 103 may be implemented based on other resistor-based memory configu-rations. For example, the memory cell 103 may be formed as a Resistive Random Access Memory (RRAM) configu-ration, a Phase Change Random Access Memory (PCRAM or PRAM) configuration, or a Magnetoresistive Random Access Memory (MRAM) configuration. In some other embodiments, the fuse resistors of the memory cell 103 may be implemented based on via structures or polysilicon structures. Further, in some other embodiments, the memory cell 103 may be implemented as an efuse memory cell that includes a number of fuse capacitors, in which the fuse capacitors may each be formed as a metal-insulator-metal (MIM) capacitor or a metal-oxide-metal (MOM) capacitor.

In brief overview, the one or more WL transistors and both of the first and second CG transistors can be turned on to program the respective first and second fuse resistors. For example, upon being turned on through the respective WL line, first CG line, and second CG line, those two fuse resistors can be programmed at the same time by applying a same programming voltage on the BL. Randomly, one of the first and second fuse resistors can be blown faster than the other, and consequently, a logic state of the memory cell can be determined, according to which of the two fuse resistors has been blown. Such randomly programmed logic states of the memory cells can constitute the basis of a PUF signature. Detailed descriptions on configurations and operations of the memory cell 103 and its application to generate a PUF signature will be discussed below with respect to FIGS. 4, 5 and 6.

The row decoder 104 is a hardware component that can receive a row address of the memory array 102 and assert a conductive structure (e.g., the WL) at that row address. The column decoder 106 is a hardware component that can receive a column address of the memory array 102 and assert a number of conductive structures (e.g., the BL and one or more of the CG lines) at that column address. The I/O circuit 108 is a hardware component that can access (e.g., read, program) each of the memory cells 103 asserted through the row decoder 104 and column decoder 106. The authentication circuit 110 is a hardware component that can generate a PUF signature based on respective logic states of the memory cells read by the I/O circuit 108. The control logic circuit 112 is a hardware component that can control the coupled components (e.g., 102 through 110). Detailed descriptions on configurations and operations of memory system 100 are provided below with respect to the flow chart of FIG. 7.

Figure 2:
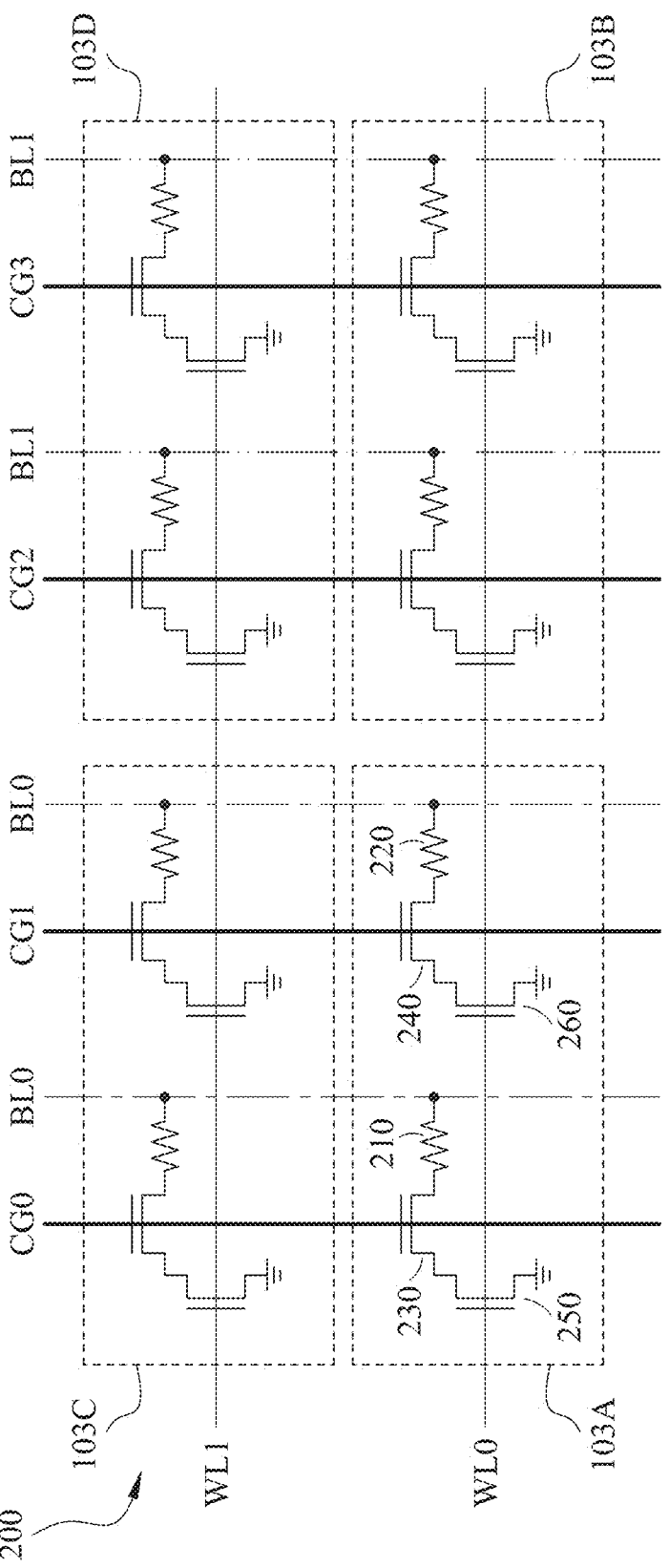
FIG. 2 illustrates an example schematic diagram of a portion of the memory array of FIG. 1 that include a number of memory cells in accordance with some embodiments.
Figure 3:
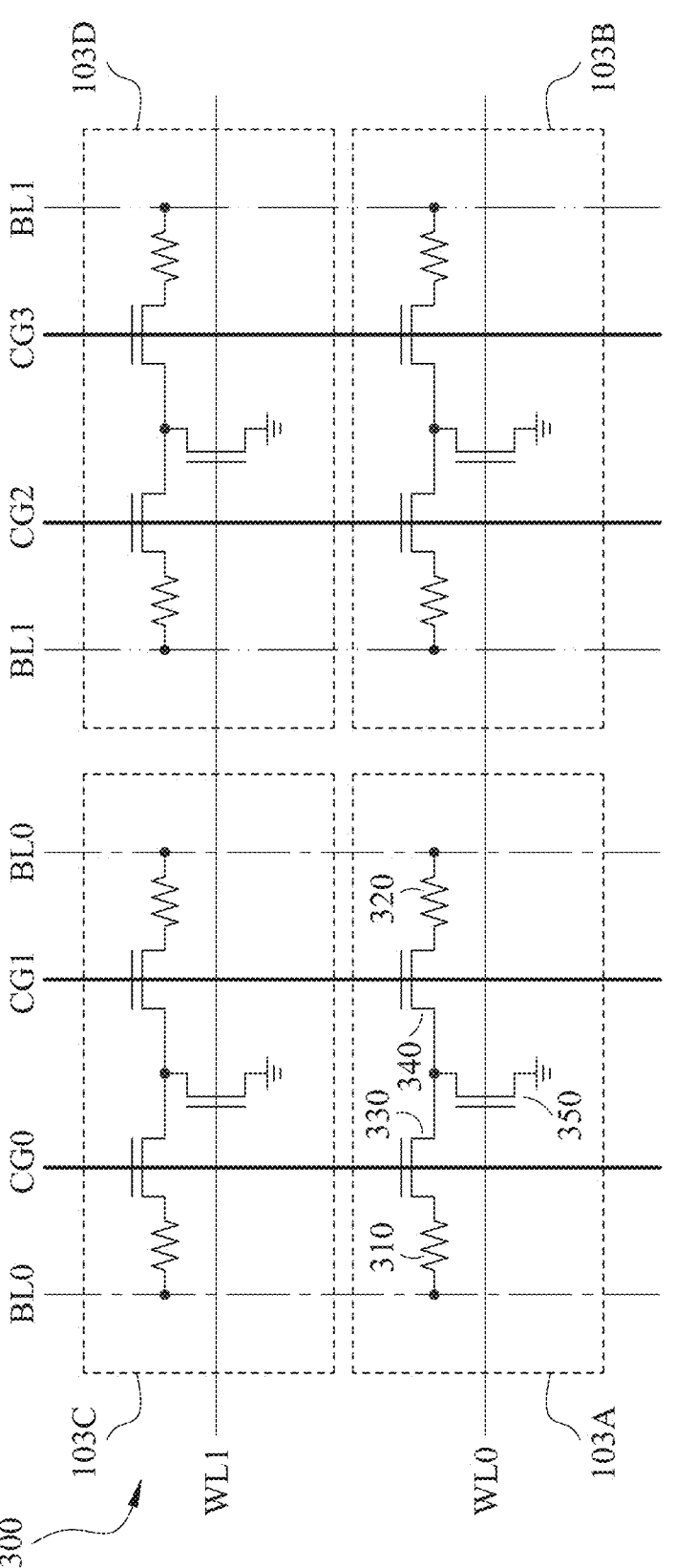
FIG. 3 illustrates another example schematic diagram of a portion of the memory array of FIG. 1 that include a number of memory cells in accordance with some embodiments.

FIGS. 2 and 3 respectively illustrate example schematic diagrams 200 and 300 of a portion of the memory device 100 (e.g., some of the memory cells 103), in accordance with some embodiments. In the illustrated examples of FIGS. 2 and 3, efuse memory cells 103A, 103B, 103C and 103D of the memory array 102 are shown, and each of the efuse memory cells 103A-103D includes at least two fuse resistors. Although four efuse memory cells 103A, 103B, 103C and 103D are shown, it should be appreciated that the memory array 102 can have any number of similar efuse memory cells, while remaining within the scope of present disclosure.

The memory cells 103 can be arranged as an array (as indicted above in FIG. 1). In FIGS. 2 and 3, the memory cells 103A and 103B may be disposed in a same row but in respectively different columns; and the memory cells 103C and 103D may be disposed in a same row but in respectively different columns. For example, the memory cells 103A and 103B are disposed in row $R_0$, but in columns $C_0$ and $C_1$, respectively; and the memory cells 103C and 103D are disposed in row $R_1$ but in columns $C_0$ and $C_1$, respectively. With such a configuration, each of the memory cells can be operatively coupled to the access lines in the corresponding row and column, respectively. In various embodiments, along each row, a number of efuse memory cells 103 is coupled to a corresponding WL; and along each column, a number of efuse memory cells 103 is coupled to a corresponding BL and a number of corresponding CG lines. For example, the efuse memory cells 103A and 103B are coupled to $WL_0$ disposed in row $R_0$, and coupled to $BL_0$, $CG_0$, $CG_1$ disposed in column $C_0$ and $BL_1$, $CG_2$, $CG_3$ disposed in column $C_1$, respectively; and the efuse memory cells 103C and 103D are coupled to $WL_1$ disposed in row $R_1$, and coupled to $BL_0$, $CG_0$, $CG_1$ disposed in column $C_0$ and $BL_1$, $CG_2$, $CG_3$ disposed in column $C_1$, respectively.

In some embodiments, the efuse memory cells 103 can include a first fuse resistor, a second fuse resistor, a first CG transistor, a second CG transistor, a first WL transistor, and a second WL transistor, in which the first CG transistor and the second CG transistor have their source/drain terminals coupled to ground through the first WL transistor and the second WL transistor, respectively, as shown in the illustrative example of FIG. 2. In other embodiments, the efuse memory cells 103 can include a first fuse resistor, a second fuse resistor, a first CG transistor, a second CG transistor, and a common WL transistor, in which the first CG transistor and the second CG transistor have their source/drain terminals coupled to ground through the common WL transistor, as shown in the illustrative example of FIG. 3.

Referring first to the schematic diagram 200 of FIG. 2, each of the efuse memory cells 103A to 103D includes a first fuse resistor 210, a second fuse resistor 220, a first CG transistor 230, a second CG transistor 240, a first WL transistor 250, and a second WL transistor 260. Such a schematic design in FIG. 2 is referred to as 4-transistor-2-resistor (4T2R) configuration. The first CG transistor 230, the second CG transistor 240, the first WL transistor 250, and the second WL transistor 260 each can be implemented as an n-type transistor. However, it should be understood that each of these transistors can be implemented as a p-type transistor, while remaining within the scope of the present disclosure. The first fuse resistor 210, the first CG transistor 230, and the first WL transistor 250 are connected to each other in series between the $BL_0$ and ground; and the second fuse resistor 220, the second CG transistor 240, and the second WL transistor 260 are also connected to each other in series between the $BL_0$ and ground.

Using the efuse memory cell 103A as a representative example, the first fuse resistor 210 has a first end (or terminal) connected to the $BL_0$ and a second end (or terminal) connected to a first source/drain terminal of the first CG transistor 230; the second fuse resistor 220 has a first end (or terminal) also connected to the $BL_0$ and a second end (or terminal) connected to a first source/drain terminal of the second CG transistor 240; the first CG transistor 230 has a second source/drain terminal connected to a first source/drain terminal of the first WL transistor 250, with a second source/drain terminal of the first WL transistor 250 connected to ground; and the second CG transistor 240 has a second source/drain terminal connected to a first source/drain terminal of the second WL transistor 260, with a second source/drain terminal of the second WL transistor 260 connected to ground. Further, the first WL transistor 250 and second WL transistor 260 have their respective gate terminals commonly connected to the $WL_0$ (i.e., commonly gated by the $WL_0$); the first CG transistor 230 has a gate terminal connected to the $CG_0$ (i.e., gated by the $CG_0$); and the second CG transistor 240 has a gate terminal connected to the $CG_1$ (i.e., gated by the $CG_1$).

Referring next to the schematic diagram 300 of FIG. 3, each of the efuse memory cells 103A to 103D includes a first fuse resistor 310, a second fuse resistor 320, a first CG transistor 330, a second CG transistor 340, and a common WL transistor 350. Such a schematic design in FIG. 3 is referred to as 3-transistor-2-resistor (3T2R) configuration. The first CG transistor 330, the second CG transistor 340, and the WL transistor 350 each can be implemented as an n-type transistor. However, it should be understood that each of these transistors can be implemented as a p-type transistor, while remaining within the scope of the present disclosure. The first fuse resistor 310, the first CG transistor 330, and the WL transistor 350 are connected in series between the $BL_0$ and ground; and the second fuse resistor 320, the second CG transistor 340, and the WL transistor 350 are also connected in series between the $BL_0$ and ground.

Using the efuse memory cell 103A as a representative example, the first fuse resistor 310 has a first end (or terminal) connected to the $BL_0$ and a second end (or terminal) connected to a first source/drain terminal of the first CG transistor 330; the second fuse resistor 320 has a first end (or terminal) also connected to the $BL_0$ and a second end (or terminal) connected to a first source/drain terminal of the second CG transistor 340; and the first CG transistor 330 and the second CG transistor 340 each have a second source/drain terminal connected to a first source/drain terminal of the WL transistor 350, with a second source/drain terminal of the WL transistor 350 connected to ground. Further, the WL transistor 350 has its gate terminal connected to the $WL_0$ (i.e., commonly gated by the $WL_0$); the first CG transistor 330 has a gate terminal connected to the $CG_0$ (i.e., gated by the $CG_0$); and the second CG transistor 340 has a gate terminal connected to the $CG_1$ (i.e., gated by the $CG_1$).

To program the efuse memory cell 103, the corresponding WL transistor(s), and first and second CG transistors are first activated. In the example where these transistors are each implemented as an n-type transistor, the one or more WL transistors, and first and second CG transistors are activated (e.g., turned on) by applying a signal at a logic high state to each of the WL and CG lines. Next, a programming signal (e.g., voltage) is applied on the BL. With the WL transistor and both of the first and second CG transistors (and the corresponding WL transistor(s)) being turned on, the programming voltage can be applied across each of the first and second fuse resistors. Alternatively stated, two conduction paths are available through at least the first fuse resistor and the second fuse resistor, respectively.

Due to processing variability, even though those two fuse resistors are formed of the same materials and made in identical dimensions, one of the two fuse resistors will be blown faster than the other. For example, once one of the fuse resistors is blown (e.g., one of the fuse resistors becoming an open circuit and the other remaining as a short circuit), a sudden decrease of voltage can be present on the BL, which can automatically stop the programming process on the efuse memory cell 103. As a result, the efuse memory cell 103 can be "randomly" programmed to a first logic state or a second logic state. Whether the first or second logic state is programmed into the memory cell can correspond to which of the fuse resistors has been blown (earlier than other), which may be determined (or detected) based on a reading process.

To read the efuse memory cell 103, the corresponding one or more WL transistors, and only one of the first or second CG transistor are first activated (e.g., turned on). In some embodiments, which of the CG transistor is selected to be activated is fixed across the whole memory array. For example, across all the columns of a memory array, one of the even-numbered CG line (e.g., $CG_0$) or odd-numbered CG line (e.g., $CG_1$) is activated during the reading process. Next, a reading signal (e.g., voltage) is applied on the BL. As one of the fuse resistors has been randomly programmed (blown), only one conduction path can be established from the BL, through the fuse resistor that has not been blown and the selected (activated) CG transistor, and to ground. On the other hand, no conduction path can be established from the BL, through the blown fuse resistor and the selected (activated) CG transistor, and to ground. For example, if the selected CG transistor is connected to the blown fuse resistor, a conduction path will not be established; and if the selected CG transistor is connected to the fuse resistor that has not been blown, a conduction path will be established.

In some embodiments, without a conduction path being established (i.e., the fuse resistor connected to the selected CG transistor has been blown), the efuse memory cell 103 is determined to be at a first logic state (e.g., a logic 1); and with a conduction path being established (i.e., the fuse resistor connected to the selected CG transistor has not been blown), the efuse memory cell 103 is determined to be at a second logic state (e.g., a logic 0). Stated another way, each of the efuse memory cells 103 can be randomly programmed into a logic 1 or 0. Based on such a randomly programmed logic state on each of the efuse memory cells, a PUF signature (formed of respective PUF bits of the efuse memory cells) can be generated.

Figures 4, 5:
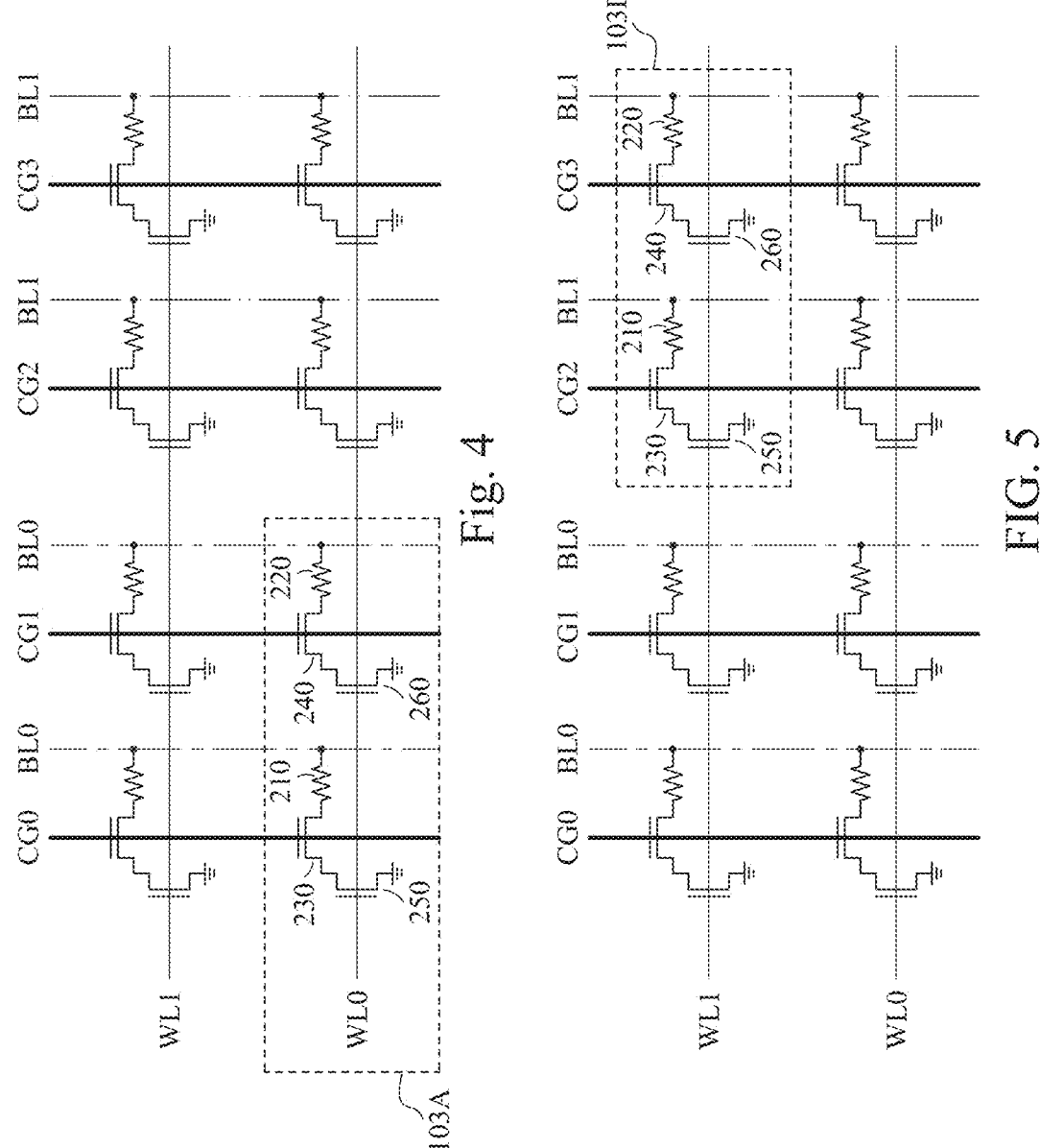
FIGS. 4 and 5 illustrate examples where two memory cells shown in FIG. 2 are respectively programmed, in accordance with some embodiments.

FIGS. 4 and 5 illustrate an example where the efuse memory cells 103A and 103D are sequentially programmed, in accordance with some embodiments. Following the principles discussed above, the efuse memory cells 103A and 103D can each be randomly programmed into a first logic state (e.g., logic 1 with a blown fuse resistor) or a second logic state (e.g., logic 0 with an intact fuse resistor). The numerical values of signals discussed below are merely provided for illustrative purposes, and thus, other values can be contemplated while remaining within the scope of the present disclosure.

Referring first to FIG. 4, to program the efuse memory cell 103A, the $WL_0$ is asserted through applying a voltage signal corresponding to a logic high state (e.g., about 0.75V), while other word lines (e.g., $WL_1$) are each applied with a voltage signal corresponding to a logic low state (e.g., about 0V). Concurrently or subsequently, the $CG_0$ and $CG_1$ are also asserted through applying a voltage signal that is also about 0.75V, while other control gate lines (e.g., $CG_2$ and $CG_3$) are each applied with a voltage signal that is about 0V. As such, the WL transistors 250 and 260 and the CG transistors 230 and 240 of the efuse memory cell 103A can be turned on, and the WL transistors and CG transistors of other efuse memory cells remain deactivated. Next, a programming voltage (e.g., about 1.2V-1.5V) is applied on the $BL_0$, while other bit lines (e.g., $BL_1$) are each applied with a voltage signal that is about 0V. Consequently, two conduction paths are available to conduct current from the $BL_0$ to ground. As discussed above, one of the fuse resistors (e.g., 210) will be blown earlier than the other (e.g., 220). The voltage present on the $BL_0$ can thus suddenly drop, which causes the programming process (e.g., on the still intact fuse resistor 220) to stop.

Referring next to FIG. 5, to program the efuse memory cell 103D, the $WL_1$ is asserted through applying a voltage signal corresponding to a logic high state (e.g., about 0.75V), while other word lines (e.g., $WL_0$) are each applied with a voltage signal corresponding to a logic low state (e.g., about 0V). Concurrently or subsequently, the $CG_2$ and $CG_3$ are also asserted through applying a voltage signal that is also about 0.75V, while other control gate lines (e.g., $CG_0$ and $CG_1$) are each applied with a voltage signal that is about 0V. As such, the WL transistors 250 and 260 and the CG transistors 230 and 240 of the efuse memory cell 103D can be turned on, and the WL transistors and CG transistors of other efuse memory cells remain deactivated. Next, a programming voltage (e.g., about 1.2V-1.5V) is applied on the $BL_1$, while other bit lines (e.g., $BL_0$) are each applied with a voltage signal that is about 0V. Consequently, two conduction paths are available to conduct current from the $BL_1$ to ground. As discussed above, one of the fuse resistors (e.g., 220) will be blown earlier than the other (e.g., 210). The voltage present on the $BL_1$ can thus suddenly drop, which causes the programming process (e.g., on the still intact fuse resistor 210) to stop.

Figure 6:
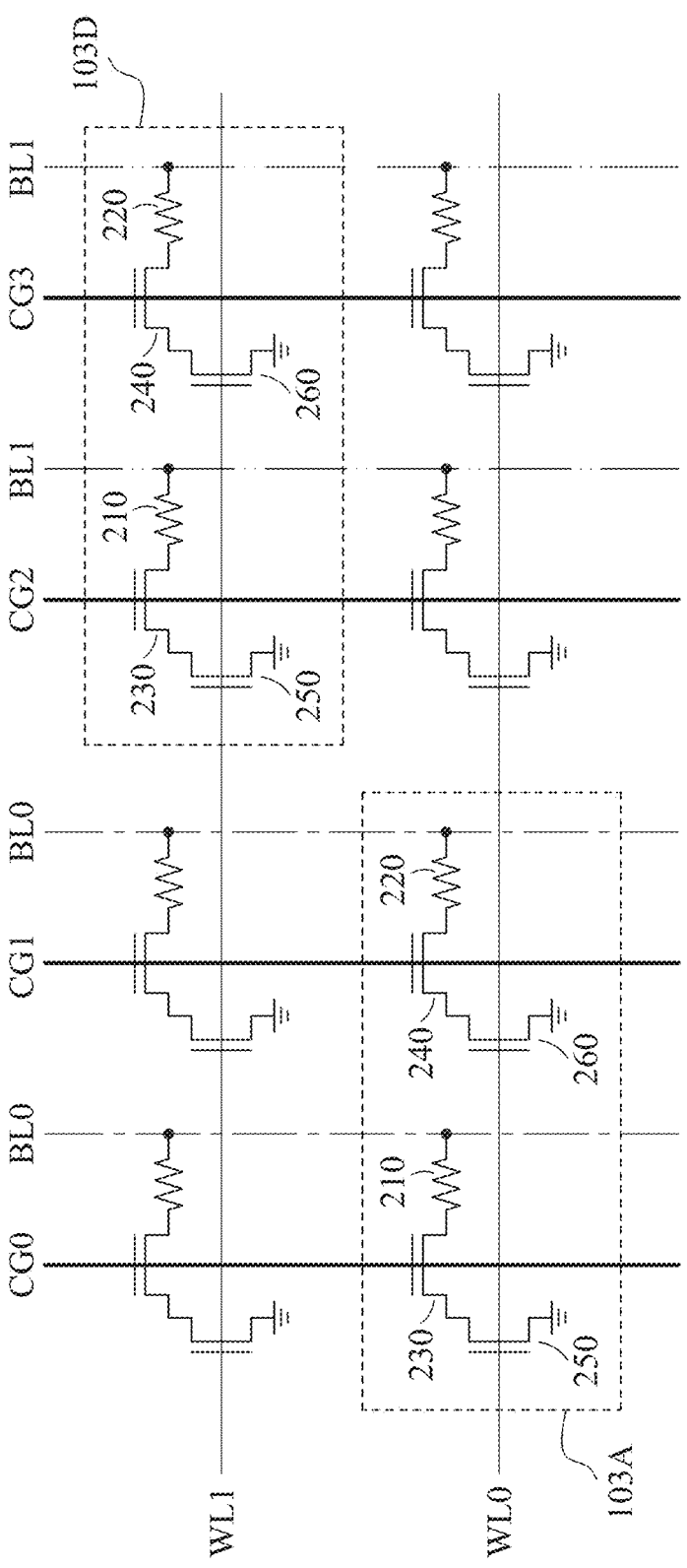
FIG. 6 illustrates an example where two memory cells shown in FIG. 2 are respectively read in accordance with some embodiments.

FIG. 6 illustrates an example where the efuse memory cells 103A and 103D (after being programmed) are sequentially read in accordance with some embodiments. Following the example discussed in FIGS. 4-5, the efuse memory cell 103A has its fuse resistor 210 blown while the efuse memory cell 103D has its fuse resistor 220 blown as shown in FIG. 6. The numerical values of signals discussed below are merely provided for illustrative purposes, and thus other values can be contemplated while remaining within the scope of the present disclosure.

To read the efuse memory cell 103A, the $WL_0$ is asserted through applying a voltage signal corresponding to a logic high state (e.g., about 0.75V), while other word lines (e.g., $WL_1$) are each applied with a voltage signal corresponding to a logic low state (e.g., about 0V). Concurrently or subsequently, one of the $CG_0$ or $CG_1$ (e.g., $CG_0$) is asserted through applying a voltage signal that is also about 0.75V, while other control gate lines (e.g., $CG_1$, $CG_2$ and $CG_3$) are each applied with a voltage signal that is about 0V. As such, the WL transistors 250 and 260 and the CG transistor 230 of the efuse memory cell 103A can be turned on, and the CG transistor 240 of the efuse memory cell 103A remains deactivated. Next, a reading voltage (e.g., about 1.2V-1.5V) is applied on the $BL_0$, while other bit lines (e.g., $BL_1$) are each applied with a voltage signal that is about 0V. One conduction path is made available to conduct current from the $BL_0$, through the fuse resistor 210, the CG transistor 230, and the WL transistor 250, to ground. Since the fuse resistor 210 has been burned (i.e., programmed as an open circuit), no current can flow through such a conduction path. Consequently, no current (or a current level less than a predefined threshold) is present on the $BL_0$, and thus the efuse memory cell 103A can be determined as being permanently programmed to logic 1 (e.g., having a blown fuse resistor connected to the activated CG transistor).

Similarly, to read the efuse memory cell 103D, the $WL_1$ is asserted through applying a voltage signal corresponding to a logic high state (e.g., about 0.75V), while other word lines (e.g., $WL_0$) are each applied with a voltage signal corresponding to a logic low state (e.g., about 0V). Concurrently or subsequently, one of the $CG_2$ or $CG_3$ (e.g., $CG_2$) is asserted through applying a voltage signal that is also about 0.75V, while other control gate lines (e.g., $CG_3$, $CG_0$ and $CG_1$) are each applied with a voltage signal that is about 0V. As such, the WL transistors 250 and 260 and the CG transistor 230 of the efuse memory cell 103D can be turned on, and the CG transistor 240 of the efuse memory cell 103D remains deactivated. Next, a reading voltage (e.g., about 1.2V-1.5V) is applied on the $BL_1$, while other bit lines (e.g., $BL_0$) are each applied with a voltage signal that is about 0V. One conduction path is made available to conduct current from the $BL_1$, through the fuse resistor 210, the CG transistor 230, and the WL transistor 250, to ground. Since the fuse resistor 210 has not been burned (i.e., programmed as an open circuit), current can flow through such a conduction path. Consequently, a current (or a current level higher than a predefined threshold) is present on the $BL_1$, and thus the efuse memory cell 103D can be determined as being permanently programmed to logic 0 (e.g., having an intact fuse resistor connected to the activated CG transistor).

Figure 7:
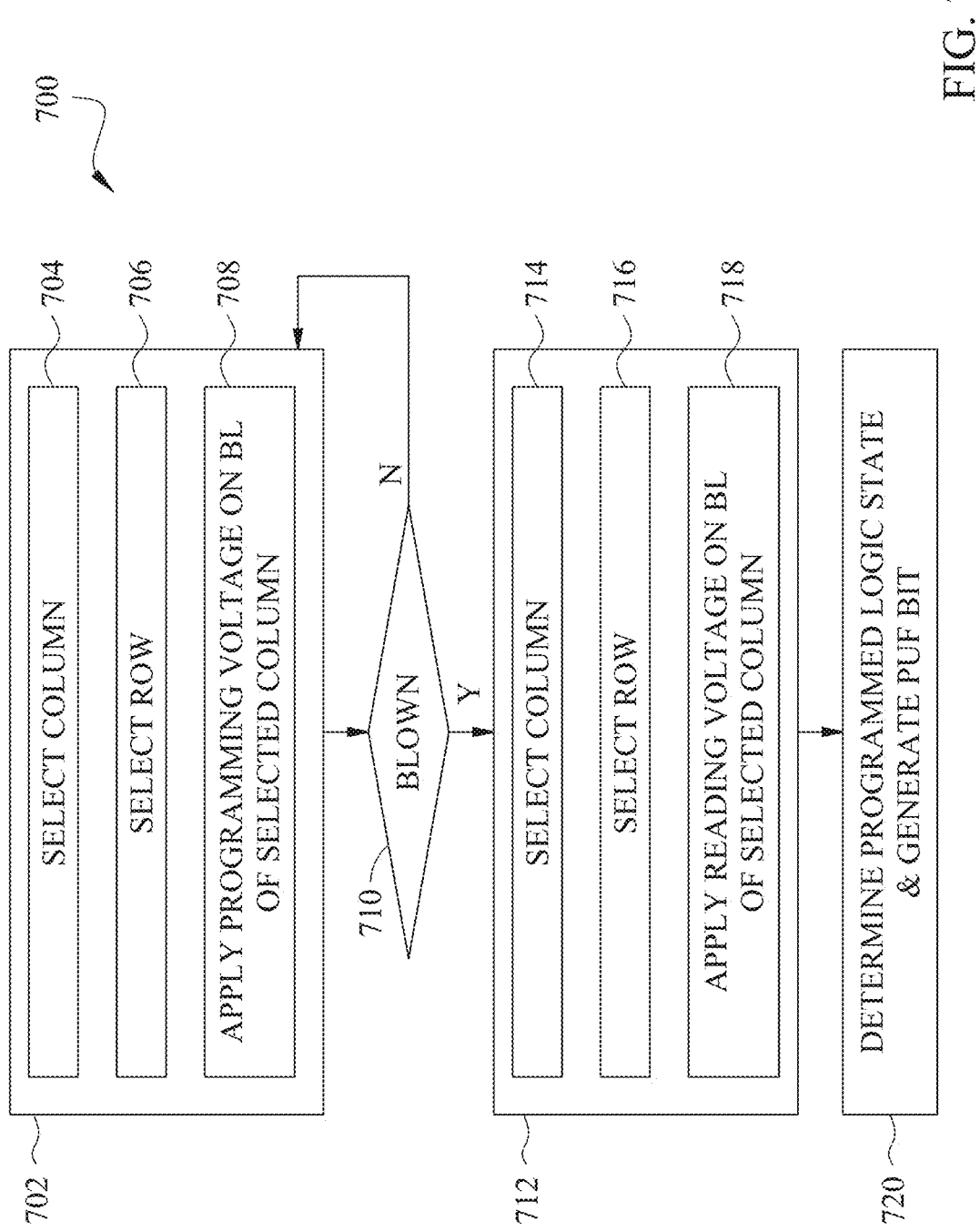
FIG. 7 illustrates a flow chart of an example method for generating a PUF bit based on the memory array of FIG. 1 in accordance with some embodiments.

FIG. 7 illustrates a flow chart of an example method 700 for generating a physically unclonable function (PUF) signature based on an efuse memory cell including a pair of fuse resistors and multiple CG/WL transistors ("mT2R" configuration) in accordance with various embodiments. Operations of method 700 are performed by at least the components illustrated in FIGS. 1 and 2. For purposes of discussion, the following embodiment of the method 700 will be described in conjunction with FIGS. 1 and 2. The illustrated embodiment of the method 700 is merely an example so that any of a variety of operations may be omitted, re-sequenced, and/or added, while remaining within the scope of the present disclosure.

The method 700 may start with operation 702 of a programing process. In some embodiments, operation 702 can include operation 704 in which a column is selected, operation 706 in which a row is selected, and operation 708 in which a programming voltage is applied on a BL of the selected column. It should be noted the sequence of operations 704 to 708 can be changed, while remaining within the scope of present disclosure. For example, operations 704 and 706 may be switched.

Referring first to operation 704, the control logic circuit 112 can provide a column address for the column decoder 106 to select one of the columns $C_1$ to $C_N$ of the memory array 102. In some embodiments, the column address used during the programming process may not specify which of the CG lines to be selected. Stated another way, the column decoder 106 may assert both of the CG lines and the BL of the selected column. Upon selecting a column, the I/O circuit 108 can provide a voltage (e.g., corresponding to a logic high state when the CG transistor is an n-type transistor) to each of the CG lines arranged in the selected column, e.g., $CG_0$ and $CG_1$ of FIG. 2. As such, the CG transistors 230 and 240 can be turned on.

Next, in operation 706, the control logic circuit 112 can provide a row address for the row decoder 104 to select one of the rows $R_1$ to $R_M$ of the memory array 102. In some embodiments, the row address may specify which of the WLs to be selected. Upon selecting a row, the I/O circuit 108 can provide a voltage (e.g., corresponding to a logic high state when the WL transistor is an n-type transistor) to the WL arranged in the selected row, e.g., $WL_0$ of FIG. 2. As such, the WL transistors 250 and 260 can be turned on. As such, the memory cell arranged in the intersection of the selected column and row (e.g., 103A) can be programmed.

Next, in operation 708, the programming voltage is applied on the BL of the selected column, e.g., $BL_0$ of FIG. 2. By turning on the CG transistors 230-240 and the WL transistors 250-260, two conduction paths, one of which extends from the $BL_0$, through the fuse resistor 210, CG transistor 230 and WL transistor 250, and to ground, and the other of which extends from the $BL_0$, through the fuse resistor 220, CG transistor 240 and WL transistor 260, and to ground, can be formed. As such, the programming voltage, applied on the $BL_0$, can randomly blow one of the fuse resistor 210 or the fuse resistor 220.

Next, the method 700 may proceed to operation 710 to determine whether or not one of the fuse resistors of the selected memory cell has been blown (i.e., programmed). If so, the method 700 may proceed to operation 712 including one or more reading processes. If not, the method 700 may route back to operation 702 to perform the programing process again. In various embodiments, the I/O circuit 108 can determine whether one of the fuse resistors has been blown based on detecting a voltage decrease present on the selected BL (e.g., $BL_0$), as discussed above.

In some embodiments, operation 712 can include operation 714 in which a column is selected, operation 716 in which a row is selected, and operation 718 in which a reading voltage is applied on a BL of the selected column. It should be noted the sequence of operations 714 to 718 can be changed, while remaining within the scope of present disclosure. For example, operations 714 and 716 may be switched.

Referring first to operation 714, the control logic circuit 112 can provide a column address for the column decoder 106 to select one of the columns $C_1$ to $C_N$ of the memory array 102. In some embodiments, the column address used during the reading process may specify which of the CG lines to be selected. Stated another way, the column decoder 106 may assert only one of the CG lines and the BL of the selected column. Upon selecting a column, the I/O circuit 108 can provide a voltage (e.g., corresponding to a logic high state when the CG transistor is an n-type transistor) to the CG line arranged in the selected column, e.g., $CG_0$ of FIG. 2. As such, the CG transistor 230 can be turned on, while the other CG transistor 240 can be turned off.

Next, in operation 716, the control logic circuit 112 can provide a row address for the row decoder 104 to select one of the rows $R_1$ to $R_M$ of the memory array 102. In some embodiments, the row address may specify which of the WLs to be selected. Upon selecting a row, the I/O circuit 108 can provide a voltage (e.g., corresponding to a logic high state when the WL transistor is an n-type transistor) to the WL arranged in the selected row, e.g., $WL_0$ of FIG. 2. As such, the WL transistors 250 and 260 can be turned on. As such, the memory cell arranged in the intersection of the selected column and row (e.g., 103A) can be read.

Next, in operation 718, the reading voltage is applied on the BL of the selected column, e.g., $BL_0$ of FIG. 2. By turning on the CG transistor 230 and the WL transistors 250-260, one conduction path, which extends from the $BL_0$, through the fuse resistor 210, CG transistor 230 and WL transistor 250, and to ground, can become available pending whether the fuse resistor 210 has been randomly blown. For example, the reading voltage, applied on the $BL_0$, can generate current flowing through the conduction path if the fuse resistor 210 remains intact (not blown). In other words, a short circuit forms (or remains) from the $BL_0$, through the fuse resistor 210, CG transistor 230 and WL transistor 250, and to ground. On the other hand, if the fuse resistor 210 has been blown, no current can be generated. In other word, an open circuit forms between the $BL_0$ and ground.

The method 700 may continue to operation 720 in which a logic state programmed into the memory cell is determined, and a bit of a PUF signature is generated based on the determined logic state. For example, the control logic circuit 112 can determine the logic state programmed into the memory cell 103A based on the reading process 712, e.g., whether the current is present on the $BL_0$. If the current or a sufficiently high current level is detected (e.g., by the I/O circuit 108), the control logic circuit 112 can determine that the memory cell 103A (or specifically, the fuse resistor connected to the selected CG transistor) has not been blown and in turn determine the programmed logic state as logic 0. If the current is not detected or a sufficiently low current level is detected (e.g., by the I/O circuit 108), the control logic circuit 112 can determine that the memory cell 103A (or specifically, the fuse resistor connected to the selected CG transistor) has been blown and in turn determine the programmed logic state as a logic 1. Next, the control logic circuit 112 can provide the determined logic state to the authentication circuit 110 to generate a PUF bit. Since the logic state is randomly determined based on the process variations of the pair of fuse resistors, the logic state (i.e., the PUF bit) can be randomly generated, which advantageously increases security of the memory system 100.

Figure 8A:
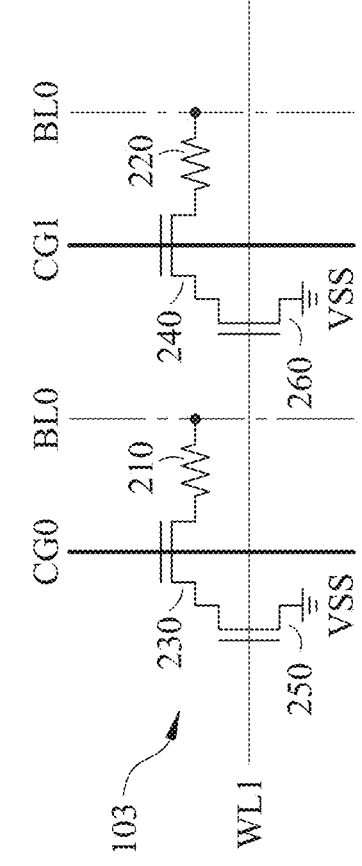
FIG. 8A illustrates an example circuit diagram of a memory device including a memory cell as shown in FIG. 2 in accordance with some embodiments.

FIG. 8A illustrates an example circuit diagram of a memory device 800A including a memory cell as shown in FIG. 2 in accordance with some embodiments. In some embodiments, the memory cell 103 in the memory device 800A is implemented as an efuse memory cell according to the schematic design 200 of FIG. 2 (the "4T2R" configuration), and thus some references of FIG. 2 will be reused. The memory cell 103 in FIG. 8A corresponds to a memory cell 103C in FIG. 2 and is used as a representative example, however, the memory cell 103 in FIG. 8A can be any one of the memory cells 103A-103D in FIG. 2.

As shown in FIG. 8A, the memory device 800A includes at least a memory cell 103 including a first fuse resistor 210, a second fuse resistor 220, a first CG transistor 230, a second CG transistor 240, a first WL transistor 250, and a second WL transistor 250. The first fuse resistor 210, the first CG transistor 230, and the first WL transistor 250 are connected in series between the $BL_0$ and ground. The second fuse resistor 220, the second CG transistor 240, and the second WL transistor 260 are also connected in series between the $BL_0$ and ground. The first WL transistor 250 and the second WL transistor 260 are commonly gated by a $WL_1$ selected from a plurality of WLs. The first CG transistor 230 and the second CG transistor 240 are respectively gated by a $CG_0$ line and a $CG_1$ line selected from a plurality of CG lines.

In the programming process, the first WL transistor 250 and the second WL transistor 260 of the memory cell 103 are concurrently activated by applying a voltage (e.g., about 0.75V) to their gate terminals, and then a programming voltage (e.g., about 1.2V-1.5V) is applied to the $BL_0$. As a result of that, either the first fuse resistor 210 or the second fuse resistor 220 is blown. The memory cell 103 is configured to randomly present a first logic state (e.g., logic 1) when the first fuse resistor 210 is blown, or a second logic state (e.g., logic 0) when the second fuse resistor 220 is blown. As such, either the first logic state or the second logic state functions as a bit (logic 1 or logic 0) of a PUF signature for the memory cell 103, and thus a bit of the PUF signature for the memory cell is generated.

In the reading process, the first WL transistor 250 and the second WL transistor 260 of the memory cell 103 are concurrently activated by applying a voltage (e.g., about 0.75V) to their gate terminals, while only one of the first CG transistor 230 or the second CG transistor 240 is activated by applying a voltage (e.g., about 0.75V) to its gate terminal. As a result of that, a bit (logic 1 or logic 0) of the PUF signature for the memory cell 103 is read or detected.

Figure 8B:
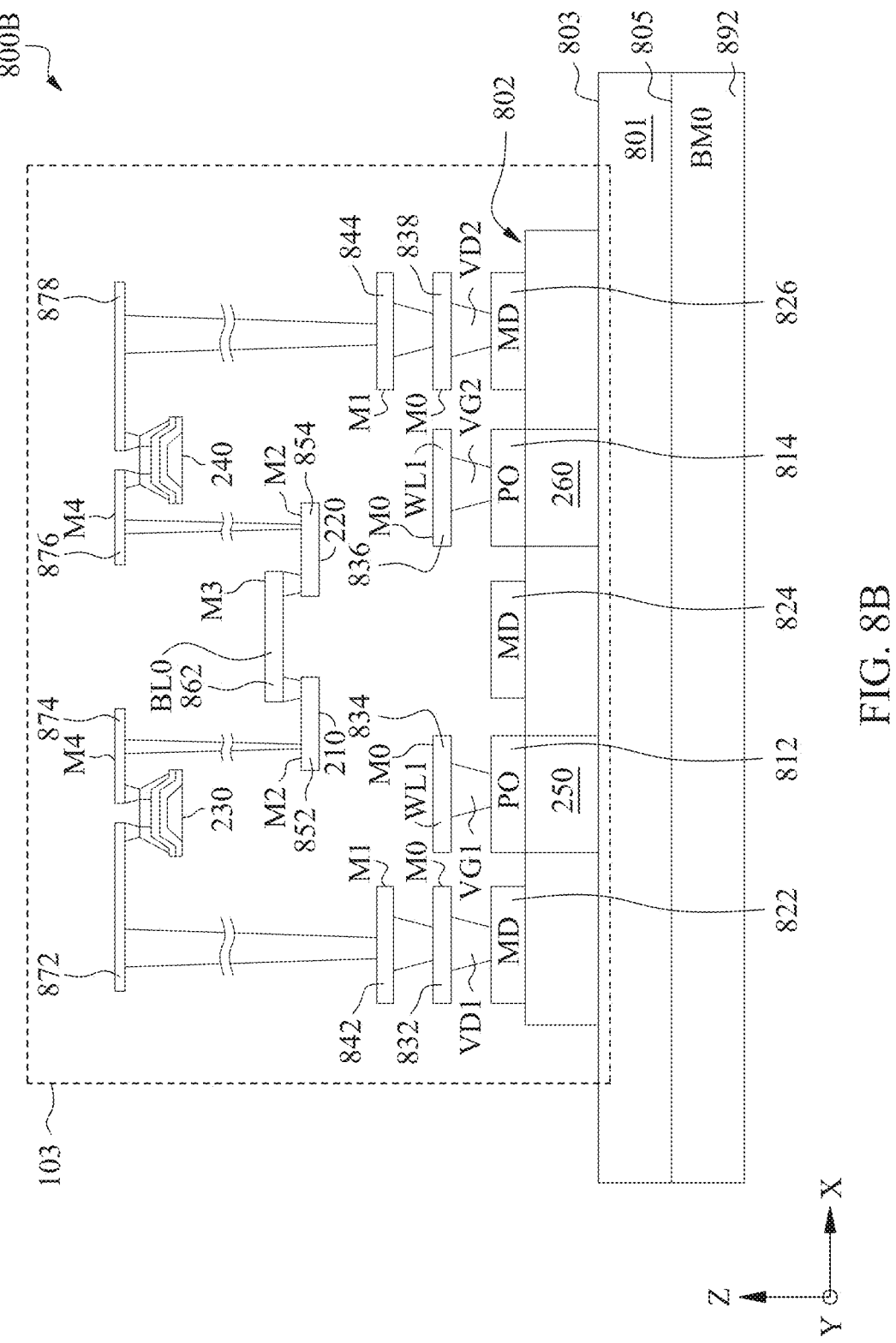
FIG. 8B illustrates a cross-sectional view of a memory device implemented based on the circuit diagram as shown in FIG. 8A in accordance with an embodiment.

Further details about the implementations of the memory device 800A designed in a 4T2R configuration as shown in FIG. 8A will be discussed with reference to cross-sectional views of FIGS. 8B-8D, and some references of FIG. 8A will be reused. FIG. 8B illustrates a cross-sectional view of a memory device 800B in accordance with an embodiment. It should be understood that the cross-sectional view as shown in FIG. 8B is simplified for illustration purposes, and thus the cross-sectional view 800B can include various other components, while remaining within the scope of present disclosure.

As shown in FIG. 8B, the memory device 800B includes a substrate 801 having a frontside 803 and a backside 805, an active region 802 formed along a major surface of the frontside surface 803 and extending in a first lateral direction (e.g., X direction), and a first gate structure 812 and a second WL gate structure 814 formed overlaying the active region 814802 and extending in parallel in a second lateral direction (e.g., Y direction).

In some embodiments, such active regions and gate structures are referred to as part of "front-end-of-line (FEOL) processing/network," since they are formed along a major surface of the frontside of the substrate. Immediately over the frontside surface of the substrate, a number of frontside metallization layers can be formed (referred to as part of "middle-end-of-line (MEOL) processing/network"). Over and further away from the major surface of the frontside of the substrate, a number of frontside metallization layers can be formed (referred to as part of "back-end-of-line (BEOL) processing/network"). Over the backside surface 805 of the substate 801, a number of backside metallization layers (e.g., BM0) can be formed.

In some embodiments, the active region 802 is formed of a stack structure (not shown) protruding from the major surface 803 of the substrate 801 in the FEOL network. The stack includes a number of semiconductor nanostructures (e.g., nanosheets) extending along the X-direction and vertically separated from each other. Portions of the semiconductor nanostructures in the stack that are overlaid by the gate structures 812 and 814 remain, while other portions are replaced with a number of epitaxial structures. The remaining portions of the semiconductor structures can be configured as the channel of a corresponding transistor, the epitaxial structures coupled to both sides (or ends) of the remaining portions of the semiconductor structures can be configured as source/drain structures (or terminals) of the transistor, and a portion of the gate structure that overlays (e.g., straddles) the remaining portions of the semiconductor structures can be configured as a gate structures (or terminal) of the transistor.

As a representative example in FIG. 8B, in the FEOL network, a portion of the active region portion 802 overlaid by the gate structure 812 can function as a channel of the first WL transistor 250 in FIG. 8A. Portions of the active region portion 802 disposed on opposite sides of the gate structure 812 are replaced with epitaxial structures, and thus can function as the source/drain terminals of the first WL transistor 250, respectively. The gate structure 812 can function as the gate terminal of the first WL transistor 250. Similarly, a portion of the active region portion 802 overlaid by the gate structure 814 can function as a channel of the second WL transistor 260 in FIG. 8A. Portions of the active region portion 802 that are disposed on opposite sides of the gate structure 814 are replaced with epitaxial structures, and thus can function as the source/drain terminals of the second WL transistor 260, respectively. The gate structure 814 can function as the gate terminal of the second WL transistor 260. In this way, the first WL transistor 250 and the second WL transistor 260 in FIG. 8A are formed along the major surface of the frontside of the substrate in the FEOL network.

As shown in FIG. 8B, in the MEOL network, a plurality of a middle-end interconnect structures (such as 822, 824 and 826) are formed over corresponding source/drain terminals of the first WL transistor 250 and the second WL transistor 260. A middle-end interconnect structure (referred to as an MD) can connect a corresponding source/drain terminal to an upper interconnect structure through a middle-end via structure (referred to as a VD, such as VD1, VD2). A gate structure can be coupled to an upper interconnect structure through another middle-end via structure (referred to as a VG such as VG1, VG2). As such, the gate structures 812 and 814 can be coupled to one or more metal tracks formed thereupon.

Above these middle-end structures on the frontside of the substrate, a number of metallization layers can be formed (e.g., M0, M1, M2, M3, M4), each of which includes a number of metal tracks or lines embedded in a corresponding dielectric material (e.g., inter-metal dielectric (IMD)/inter-layer dielectric (ILD)). For example, as shown in FIG. 8B, the memory device 800B includes metal tracks 832, 834, 836 and 838 in the M0 layer; metal tracks 842 and 844 in the M1 layer; metal tracks 852 and 854 in the M2 layer; metal track 862 in the M3 layer; and metal tracks 872, 874, 876 and 878 in the M4 layer.

For example, the gate structure 812 is coupled to the M0 metal track 834 through VG1, and the gate structure 814 is coupled to the M0 metal track 836 through VG2. The MD 822, together with at least M0 metal track 832 and M1 metal track 842, can couple one of the source/drain terminals (e.g., an epitaxial structure) of the WL transistor 250 to one end of M4 metal track 872; and the MD 826, together with at least M0 metal track 838 and M1 metal track 844, can couple one of the source/drain terminals (e.g., an epitaxial structure) of the WL transistor 260 to one end of M4 metal track 878. The other ones of the source/drain terminals of the WL transistors 250 and 260 are commonly coupled to the MD 824. The MD 824 is coupled to a supply voltage (VSS) in some embodiments, and to the ground (GND) in other embodiments.

As shown in FIG. 8B, the memory device 800B further includes a metal track 892 in a first backside metallization layer (hereinafter "BM0 track 892"), which is the bottommost metallization layer with respect to the backside surface 805 of the substrate 801. For the sake of simplicity, only BM0 is shown in FIG. 8B. However, on the backside of the substrate, a plural number of metallization layers can be formed, each of which includes one or more metal tracks or lines embedded in a corresponding dielectric material (e.g., inter-metal dielectric (IMD) or inter-layer dielectric (ILD)).

In addition, the memory device 800B further includes a first CG transistor 230 and a second CG transistor 240 both formed in a metallization layer (e.g., M4) of the plurality of metallization layers (e.g., M1, M2, M3, M4) in the BEOL network over the frontside 803 of the substrate 801, and a first fuse resistor 210 and a second fuse resistor 220 both formed in another metallization layer (e.g., M2) of the plurality of metallization layers (e.g., M1, M2, M3, M4) in the BEOL network over the frontside 803. As shown in FIG. 8B, in some embodiments, the first CG transistor 230 and the second CG transistor 240 formed in the BEOL network are vertically farther away from the major surface of the frontside 803 than the first fuse resistor 210 and the second fuse resistor 220 formed in the BEOL network.

Referring to FIGS. 8A and 8B, M2 metal tracks 852 and 854 can function as the first fuse resistor 210 and the second fuse resistor 220. In some embodiments, the first fuse resistor 210 and the second fuse resistor 220 are commonly coupled to a BL. As shown in FIG. 8B, an end of the first fuse resistor 210 and an end the second fuse resistor 220 are commonly coupled to M3 metal track 862 that functions as a part of a BL0.

As shown in FIGS. 8A and 8B, a source/drain terminal of the first CG transistor 230 is coupled to a source/drain terminal of the first WL transistor 250 through at least MD 822, M0 metal track 832, M1 metal track 842, and M4 metal track 872, as well as some vias; and another source/drain terminal of the first CG transistor 230 is coupled to another end of the first fuse resistor 210 through at least M4 metal track 874. Similarly, a source/drain terminal of the second CG transistor 240 is coupled to a source/drain terminal of the second WL transistor 260 through at least MD 826, M0 metal track 838, M1 metal track 844, and M4 metal track 878, as well as some vias; and another source/drain terminal of the second CG transistor 240 is coupled to another end of the second fuse resistor 220 through at least M4 metal track 876.

In this way, by forming CG transistors and fuse resistors in one or more metallization layers in the BEOL network, the area and programming voltage for each memory cell of the memory device can be reduced, thereby leading to higher density of the memory cells in the memory device and improved performance of the memory device.

Figure 8C:
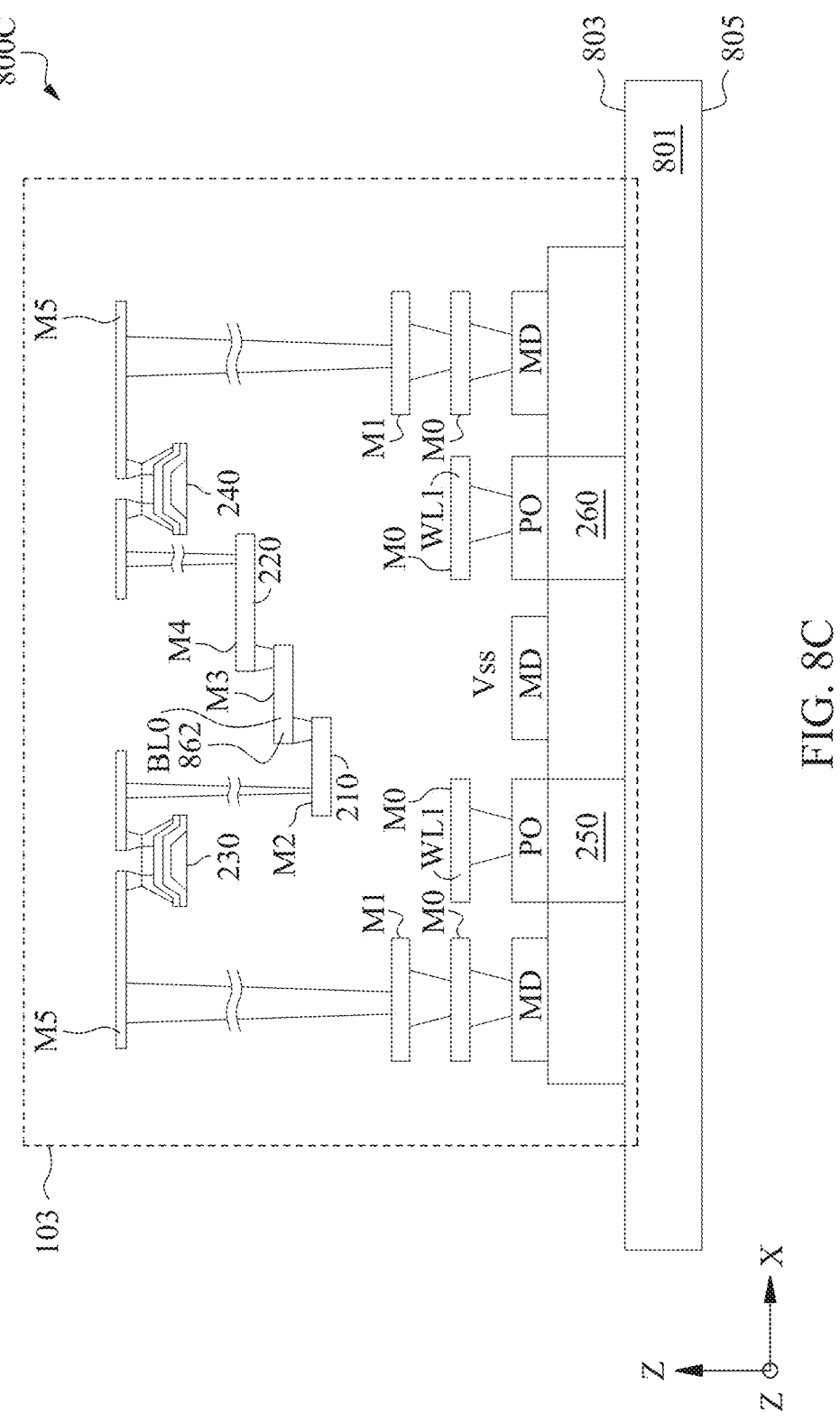
FIG. 8C illustrates a cross-sectional view of a memory device implemented based on the circuit diagram as shown in FIG. 8A in accordance with another embodiment.

FIG. 8C illustrates a cross-sectional view of a memory device 800C implemented based on the circuit diagram as shown in FIG. 8A in accordance with an embodiment. The memory device 800C is configured substantially similar to the memory device 800B but have some differences. The memory device 800C includes a memory cell 103 designed in a "4T2R" configuration and formed over a frontside 803 of a substrate 801, and a plurality of metallization layers (e.g., M0, M1, M2, M3, M4, M5) respectively disposed over the frontside 803 of the substrate 801.

Similarly, as shown in FIG. 8C, the memory cell 103 includes a first WL transistor 250 and a second WL transistor 260 both formed along a major surface of the frontside 803 in the FEOL network, a first CG transistor 230 and a second CG transistor 240 both formed in a first metallization layer (e.g., M5) of the plurality of metallization layers in the BEOL network, and a first fuse resistor 210 and a second fuse resistor 220 respectively formed in a second metallization layer (e.g., M2) and a third metallization layer (e.g., M4) of the plurality of metallization layers in the BEOL network. Different from as shown in FIG. 8B, as shown in FIG. 8C, the first fuse resistor 210 and the second fuse resistor 220 are respectively formed in different metallization layers (e.g., M2 and M4) of the plurality of metallization layers in the BEOL network.

Similarly, as shown in FIG. 8C, the first WL transistor 250 and the second transistor 260 are commonly gated to $WL_1$. The first CG transistor 230 and the second CG transistor 240 are respectively gated to CG0 and CG1. The first WL transistor 250, the first CG transistor 230, and the first fuse resistor 210 are coupled in series between BL0 (e.g., implemented by M3 metal track 862) and a supply voltage (Vss) or the ground (GND); and the second WL transistor 260, the second CG transistor 240, and the second fuse resistor 220 are coupled in series between BL0 and the a supply voltage (Vss) or the ground (GND).

Figure 8D:
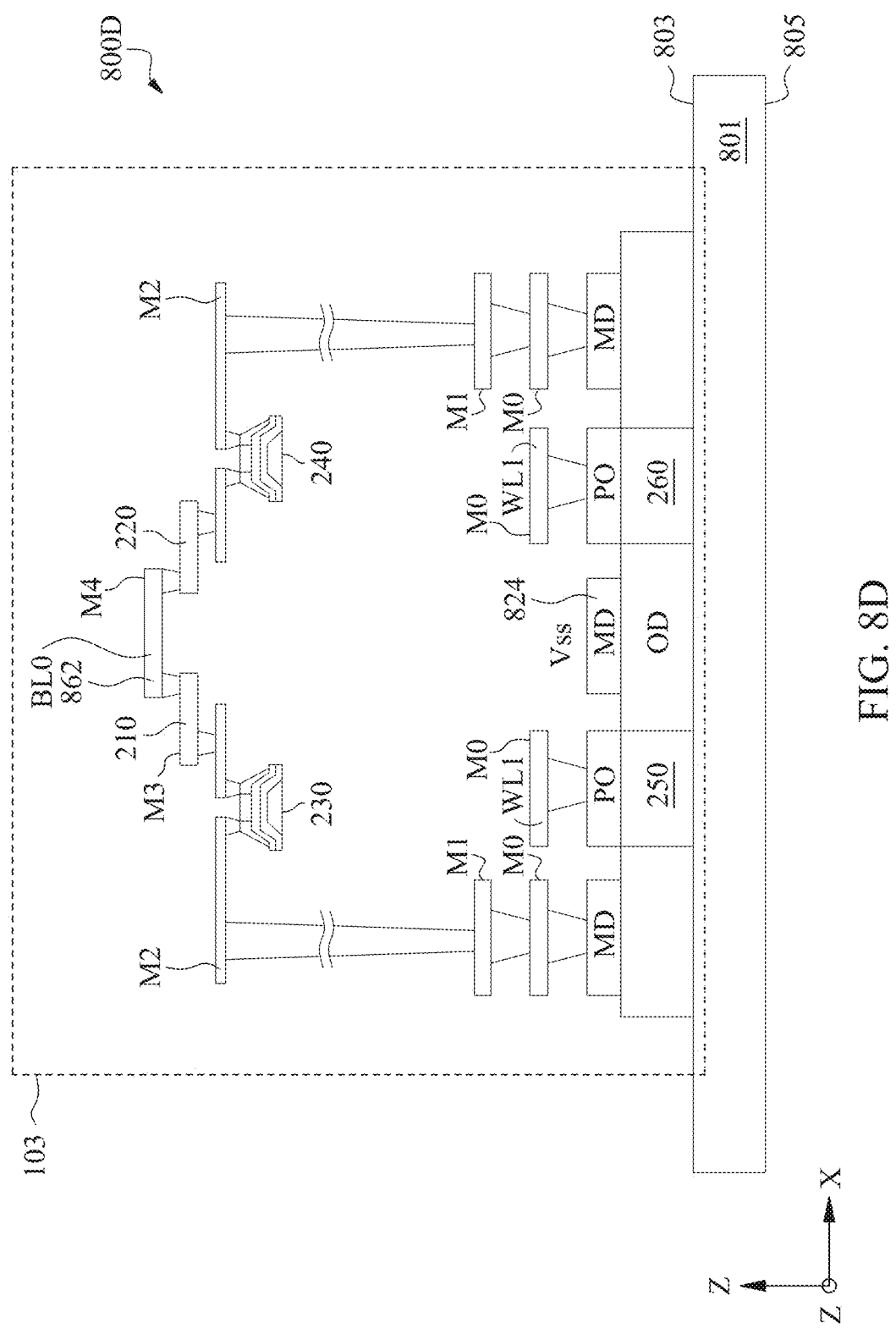
FIG. 8D illustrates a cross-sectional view of a memory device implemented based on the circuit diagram as shown in FIG. 8A in accordance with yet another embodiment.

FIG. 8D illustrates a cross-sectional view of a memory device 800D implemented based on the circuit diagram in FIG. 8A in accordance with an embodiment. The memory device 800D is configured substantially similar to the memory device 800B but have some differences. The memory device 800D includes a memory cell 103 designed in a "4T2R" configuration and formed over a frontside 803 of a substrate 801, and a plurality of metallization layers (such as M0, M1, M2, M3, M4) respectively disposed over the frontside 803.

As shown in FIG. 8D, the memory cell 103 includes a first WL transistor 250 and a second WL transistor 260 formed along a major surface of the frontside 803 in the FEOL network, a first CG transistor 230 and a second CG transistor 240 formed in a first metallization layer (e.g., M2) of the plurality of metallization layers in the BEOL network, and a first fuse resistor 210 and a second fuse resistor 220 both formed in a second metallization layer (e.g., M3) of the plurality of metallization layers in the BEOL network. However, different from as shown in FIG. 8B, the first fuse resistor 210 and the second fuse resistor 220 formed in the BEOL network are vertically farther away from the frontside 803 than the first CG transistor 230 and the second CG transistor 240 formed in the BEOL network.

Figure 9A:
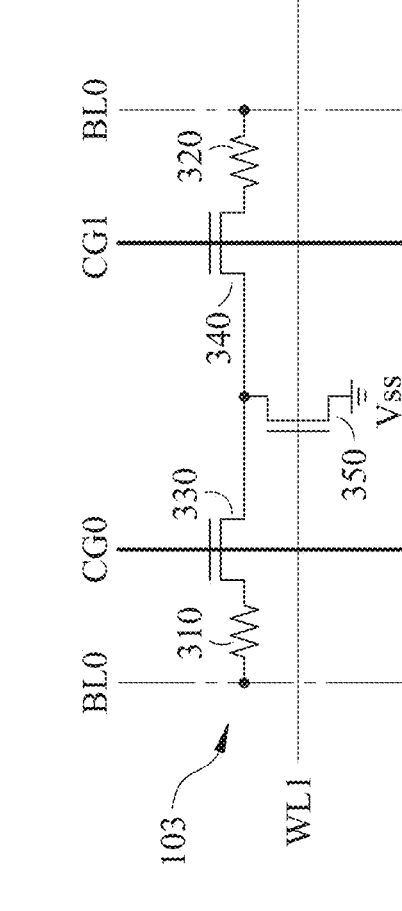
FIG. 9A illustrates an example circuit diagram of a memory device including a memory cell as shown in FIG. 3 in accordance with some embodiments.

FIG. 9A illustrates an example circuit diagram of a memory device 900A including a memory cell as shown in FIG. 3 in accordance with some embodiments. The memory cell 103 of the memory device 900A is implemented as an efuse memory cell according to the schematic design 300 of FIG. 3 (the "3T2R" configuration), and some references of FIG. 3 will be reused. The memory cell 103 in FIG. 9A (corresponding to a memory cell 103C in FIG. 3) is used as a representative example and can be any one of the memory cells 103A-103D in FIG. 3.

The memory device 900A includes at least a memory cell 103 including a first fuse resistor 310, a second fuse resistor 320, a first CG transistor 330, a second CG transistor 340, and a single WL transistor 350. The first fuse resistor 310, the first CG transistor 330, and the single WL transistor 350 are connected in series between $BL_0$ and the Vss (or the ground). The second fuse resistor 320, the second CG transistor 340, and the single WL transistor 350 are also connected in series between the $BL_0$ and the Vss (or the ground). The single WL transistor 350 is gated by $WL_1$ selected from a plurality of WLs. The first CG transistor 330 and the second CG transistor 340 are respectively gated by the $CG_0$ line and the $CG_1$ line.

In the programming process, the single WL transistor 350 of the memory cell 103 is activated by applying a voltage (e.g., about 0.75V) to it gate terminal, and then a programming voltage (e.g., about 1.2V-1.5V) is applied to the $BL_0$. As such, either the first fuse resistor 310 or the second fuse resistor 320 is blown. The memory cell 103 is configured to randomly present a first logic state (e.g., logic 1) when the first fuse resistor 310 is blown, or a second logic state (e.g., logic 0) when the second fuse resistor 320 is blown. As such, either the first logic state or the second logic state functions as a bit (logic 1 or logic 0) of a PUF signature for the memory cell 103, and thus a bit of the PUF signature for the memory cell 103 is generated.

In the reading process, the single WL transistor 350 is activated by applying a voltage (e.g., about 0.75V) to its gate terminal, and only one of the first CG transistor 330 or the second CG transistor 340 is activated by applying a voltage (e.g., about 0.75V) to its gate terminal. As such, a bit (logic 1 or logic 0) of the PUF signature for the memory cell 103 is detected.

Further details about the configurations and/or implementations of the memory device according to the circuit diagram 900A in FIG. 9A will be discussed with reference to various embodiments as illustrated in cross-sectional views of FIGS. 9B and 9C. Some references of FIG. 9A will be reused in FIGS. 9B and 9C.

Figure 9B:
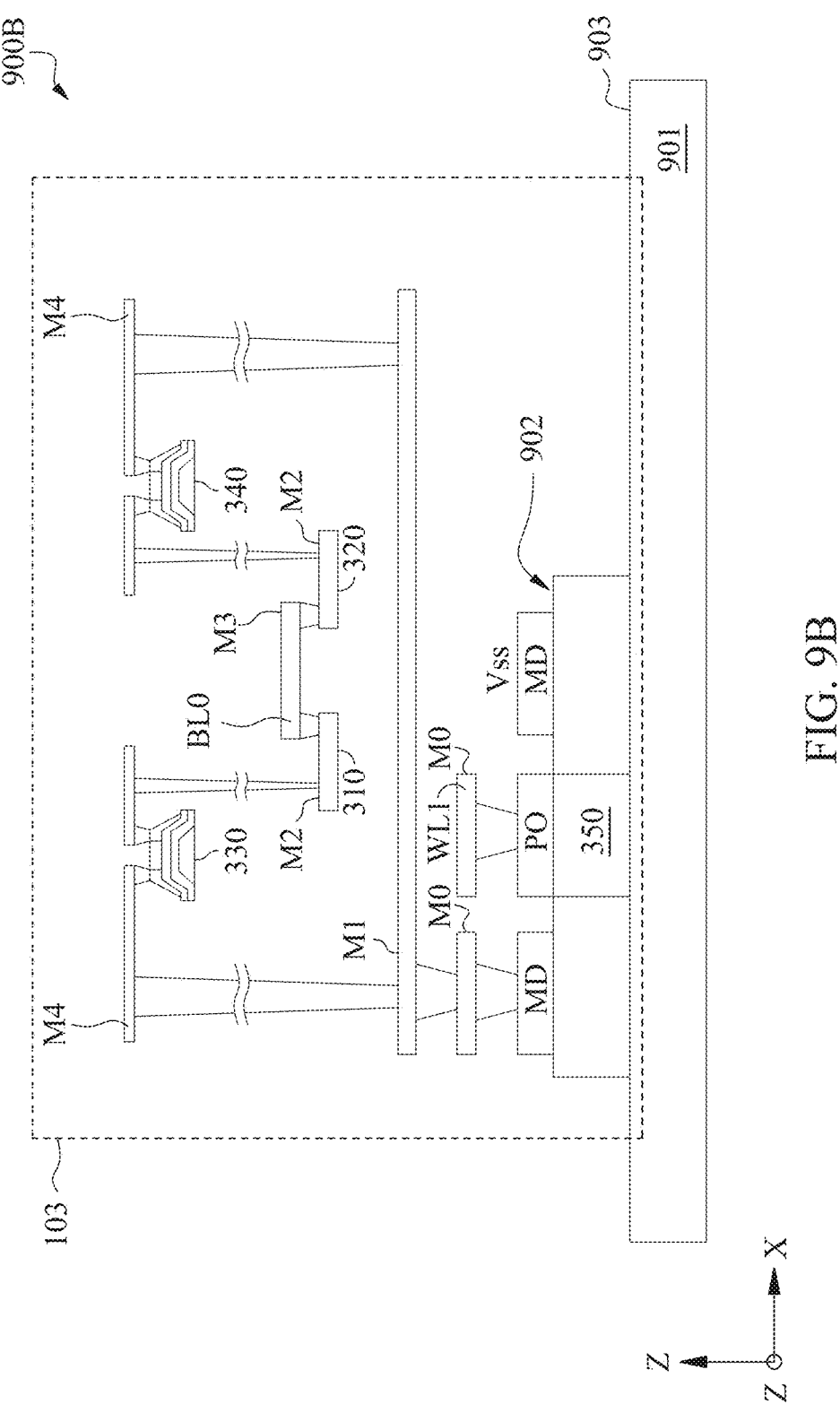
FIG. 9B illustrates a cross-sectional view of a memory device implemented based on the circuit diagram as shown in FIG. 9A in accordance with an embodiment.

FIG. 9B illustrates a cross-sectional view of a memory device 900B implemented based on the circuit diagram in FIG. 9A in accordance with an embodiment. It should be understood that the cross-sectional view 900B as shown in FIG. 9B is simplified for illustration purposes, and thus the cross-sectional view 900B can include various other components, while remaining within the scope of present disclosure.

The memory device 900B includes a memory cell 103 designed in a "3T2R" configuration and formed over a frontside of a substrate 901, and a plurality of metallization layers (e.g., M1, M2, M3, M4) respectively disposed over a frontside 903 of a substrate 901 in the BEOL network. The memory cell 103 includes a single WL transistor 350 formed in an active region 902 along a major surface of the frontside 903 in the FEOL network; a first CG transistor 330 and a second CG transistor 340 both formed in a first metallization layer (e.g., M4) of the plurality of metallization layers in the BEOL network; and a first fuse resistor 310 and a second fuse resistor 320 both formed in a second metallization layer (e.g., M2) of the plurality of metallization layers in the BEOL network.

As shown in FIGS. 9A and 9B, in some embodiments, the single WL transistor 350 is gated to $WL_1$. The first CG transistor 330 and the second CG transistor 340 are respectively gated to CG lines (e.g., $CG_0$ and $CG_1$). The single WL transistor 350, the first CG transistor 330, and the first fuse resistor 310 are coupled in series between $BL_0$ (e.g., formed by a M3 metal track) and Vss; and the single WL transistor 350, the second CG transistor 340, and the second fuse resistor 320 are coupled in series between $BL_0$ and Vss.

As shown in FIG. 9B, in some embodiments, the first CG transistor 330 and the second CG transistor 340 formed in the first metallization layer (e.g., M4) of the plurality of metallization layers in the BEOL network are vertically farther away from the frontside 903 of the substrate 901 than the first fuse resistor 310 and the second fuse resistor 320 formed in the second metallization layer (e.g., M2) of the plurality of metallization layers in the BEOL network.

Figure 9C:
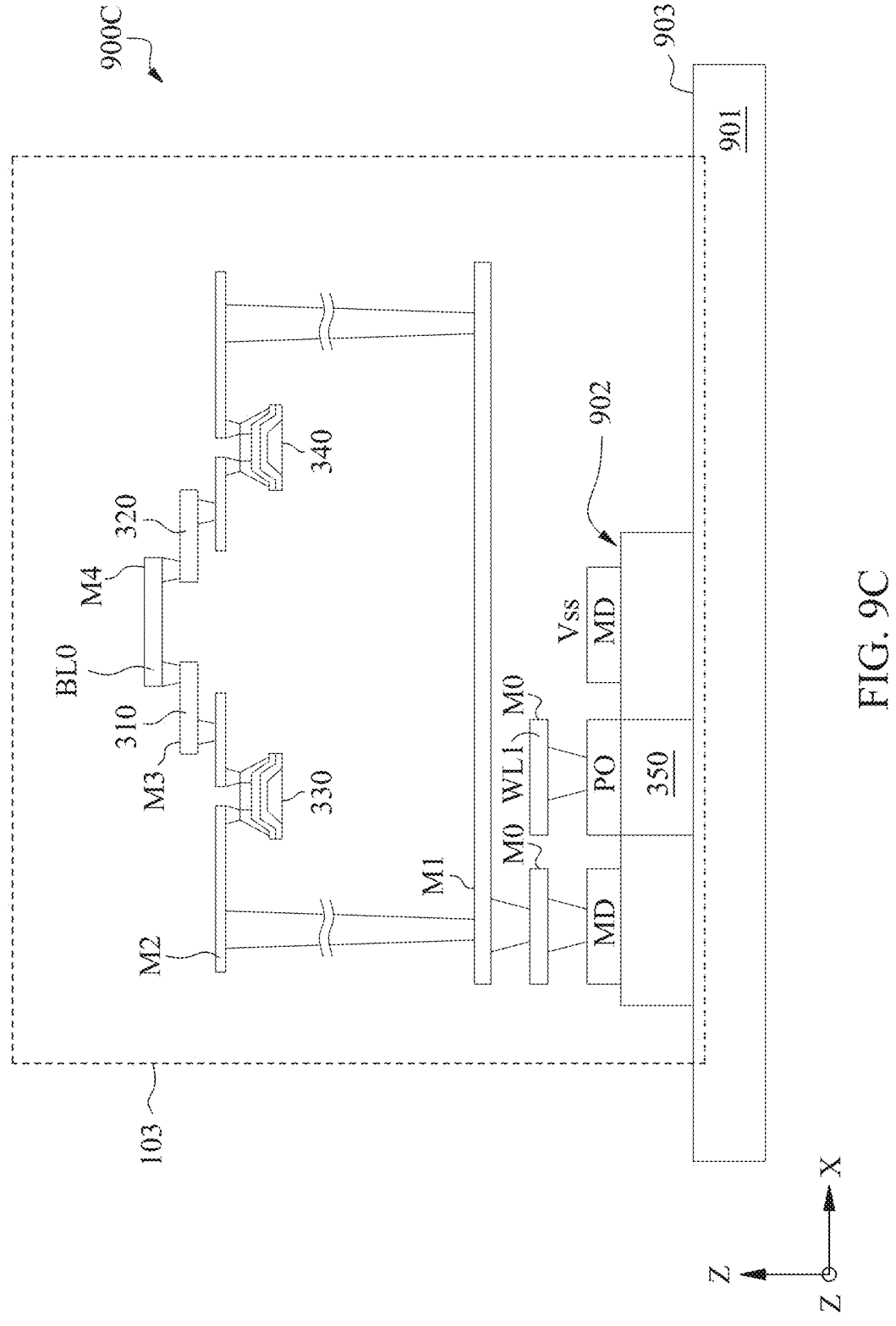
FIG. 9C illustrates a cross-sectional view of a memory device implemented based on the circuit diagram as shown in FIG. 9A in accordance with another embodiment.

FIG. 9C illustrates a cross-sectional view of a semiconductor device 900C implemented based on the circuit diagram in FIG. 9A in accordance with another embodiment. The memory device 900C in FIG. 9C is configured substantially similar to the memory device 900B as shown in FIG. 9B but have some differences.

Similarly, as shown in FIG. 9C, the memory device 900C includes a memory cell 103 designed in a "3T2R" configuration and formed over a frontside 903 of a substrate 901, and a plurality of metallization layers (e.g., M1, M2, M3, M4) respectively disposed over the frontside 903 in the BEOL network. The memory cell 103 includes a single WL transistor 350 formed in an active region 902 and along a major surface of the frontside 903 in the FEOL network; a first CG transistor 330 and a second CG transistor 340 formed in a first metallization layer (e.g., M2) of the plurality of metallization layers in the BEOL network; and a first fuse resistor 310 and a second fuse resistor 320 both formed in a second metallization layer (e.g., M3) of the plurality of metallization layers in the BEOL network.

Differently, as shown in FIG. 9C, in the memory device 900C, the first fuse resistor 310 and the second fuse resistor 320 formed in the BEOL network are vertically farther away from the frontside 903 than the first CG transistor 330 and the second CG transistor 340 formed in the BEOL network.

FIG. 10 illustrates a flow chart of an example method 1000 for fabricating a semiconductor device in accordance with some embodiments. It is noted that the method 1000 is merely an example and is not intended to limit the present disclosure. Accordingly, it is understood that additional operations may be provided before, during, and after the method 1000 of FIG. 10, and that some other operations may only be briefly described herein. The order of the operations may be interchangeable.

The method 1000 can be performed to form a memory device 800D in FIG. 8D, for example, and thus some of the references used above may be reused in the following discussion of the method 1000. As discussed above, the memory device 800D includes a memory cell 103 that is designed in 4T2R configuration and formed over a frontside 803 of a substrate 801, and a plurality of metallization layers (such as M0, M1, M2, M3, M4) respectively disposed over the frontside 803 of the substrate 801. The memory cell 103 includes a first WL transistor 250 and a second WL transistor 260 both formed along a major surface of the frontside 803 of the substrate 801 in the FEOL network, a first CG transistor 230 and a second CG transistor 240 both formed in a first one (e.g., M2) of the plurality of metallization layers in the BEOL network, and a first fuse resistor 210 and a second fuse resistor 220 both formed in a second one (e.g., M3) of the plurality of metallization layers in the BEOL network.

The method 1000 starts with operation 1002 in which a substrate is provided, in accordance with various embodiments. The substrate includes a semiconductor material substrate, for example, silicon. Alternatively, the substrate may include other elementary semiconductor material such as, for example, germanium. The substrate may also include a compound semiconductor such as silicon carbide, gallium arsenic, indium arsenide, and indium phosphide. The substrate may include an alloy semiconductor such as silicon germanium, silicon germanium carbide, gallium arsenic phosphide, and gallium indium phosphide. In one embodiment, the substrate includes an epitaxial layer. For example, the substrate may have an epitaxial layer overlying a bulk semiconductor. Furthermore, the substrate may include a semiconductor-on-insulator (SOI) structure. For example, the substrate may include a buried oxide (BOX) layer formed by a process such as separation by implanted oxygen (SIMOX) or other suitable technique, such as wafer bonding and grinding.

The method 1000 continues to operation 1004 in which a stack, including an alternating series of first nanostructures and second nanostructures, is formed, in accordance with various embodiments. Such a stack can be formed based on one of the (active region) patterns discussed above. The stack can be formed in a frontside of the substrate. In some embodiments, the first nanostructures may include SiGe sacrificial nanostructures, and the second nanostructures may include Si channel nanostructures. Such a stack may be referred to as a superlattice. In a non-limiting example, the SiGe sacrificial nanostructures can be SiGe 25%. The notation "SiGe 25%" is used to indicate that 25% of the SiGe material is Ge. It is understood the percentage of Ge in each of the SiGe sacrificial nanostructures can be any value between 0 and 100 (excluding 0 and 100), while remaining within the scope of present disclosure. In some other embodiments, the second nanostructures may include a first semiconductor material other than Si and the first nanostructures may include a second semiconductor material other than SiGe, as long as the first and second semiconductor materials are respectively characterized with different etching properties (e.g., etching rates).

The alternating series of nanostructures can be formed by epitaxially growing one layer and then the next until the desired number and desired thicknesses of the nanostructures are achieved. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The method 1000 continues to operation 1006 in which a number of dummy gate structures are formed, in accordance with various embodiments. Such a dummy gate structure can be formed based on one of the (gate structure) patterns discussed above. The dummy gate structure can extend along a direction perpendicular to the lengthwise direction of the dielectric fin structure (and the stack). Further, the dummy gate structure may be formed shorter than the dielectric fin structure in one of various embodiments, and thus, the dummy gate structure, as formed, is cut (or otherwise separated) by the dielectric fin structure.

The dummy gate structure can be formed by depositing amorphous silicon (a-Si) over the stack. Other materials suitable for forming dummy gates (e.g., polysilicon) can be used while remaining within the scope of present disclosure. The a-Si is then planarized to a desired level. A hard mask is deposited over the planarized a-Si and patterned. The hard mask can be formed from a nitride or an oxide layer. An etching process (e.g., a reactive-ion etching (RIE) process) is applied to the a-Si to form the dummy gate structure. After forming the dummy gate structure, gate spacers may be formed to extend along sidewalls of the dummy gate structure. The gate spacers can be formed by a conformal deposition of a dielectric material (e.g., silicon oxide, silicon nitride, silicon oxynitride, SiBCN, SiOCN, SiOC, or any suitable combination of those materials) followed by a directional etch (e.g., RIE).

The method 1000 proceeds to operation 1008 in which inner spacers are formed by replacing end portions of each of the SiGe sacrificial nanostructures with a dielectric material, in accordance with various embodiments. Upon forming the dummy gate structure overlaying certain portions of the stack (e.g., the portions of the stack separated by the dielectric fin structure), the non-overlaid portions of the stack are removed. Next, respective end portions of each SiGe sacrificial nanostructure of the overlaid stack are removed. The inner spacers are formed by filling such recesses of each SiGe sacrificial nanostructure with a dielectric material by chemical vapor deposition (CVD), or by monolayer doping (MLD) of nitride followed by spacer RIE. A material of the inner spacers can be formed from the same or different material as the gate spacers described above. For example, the inner spacers can be formed of silicon nitride, silicoboron carbonitride, silicon carbonitride, silicon carbon oxynitride, or any other type of dielectric material (e.g., a dielectric material having a dielectric constant k of less than about 5).

The method 1000 proceeds to operation 1010 in which a number of epitaxial structures are formed, in accordance with various embodiments. Upon forming the inner spacers, the epitaxial structures are formed using an epitaxial layer growth process on exposed ends of the Si nanostructures. In-situ doping (ISD) may be applied to form doped epitaxial structures, thereby creating the necessary junctions for a corresponding transistor (or sub-transistor). N-type and p-type FETs are formed by implanting different types of dopants to selected regions of the device to form the necessary junction(s). N-type devices can be formed by implanting arsenic (As) or phosphorous (P), and p-type devices can be formed by implanting boron (B). After forming the epitaxial structures, an inter-layer dielectric (e.g., silicon dioxide) is deposited to overlay the epitaxial structures.

The method 1000 proceeds to operation 1012 in which the dummy gate structures and the remaining SiGe sacrificial nanostructures are replaced with respective active gate structures, in accordance with various embodiments. Subsequently to forming the inter-layer dielectric, the dummy gate structures are removed by an etching process, e.g., RIE or chemical oxide removal (COR). Next, the remaining SiGe sacrificial nanostructures are removed while keeping the Si channel nanostructure substantially intact by applying a selective etch (e.g., a hydrochloric acid (HCl)). After the removal of the SiGe sacrificial nanostructures, top and bottom surfaces, and sidewalls of each of the Si channel nanostructures can be exposed, except for the sidewall in contact with the dielectric fin structure. Next, a number of active gate structures can be formed to wrap around each of the Si channel nanostructures, except for the sidewall contacting the dielectric fin structure. Each of the active gate structures includes at least a gate dielectric layer (e.g., a high-k dielectric layer) and a gate metal layer (e.g., a work function metal layer). Upon the active gate structures being formed, the transistors of the memory device can be formed. Referring to e.g., FIG. 8D, a first and a second WL transistors 250 and 260 of the memory device 800D are formed along a major surface of the frontside 803 of the substrate 801 in the FEOL network.

The method 1000 proceeds to operation 1014 in which a number of frontside interconnect structures are formed in accordance with various embodiments. Upon forming the WL transistors (e.g., 250 and 260), a number of middle-end interconnect structures (e.g., VGs, MDs) are formed over the transistors. For example, referring to FIG. 8B, a number of VGs (e.g., VG1 and VG2) can be formed to couple to gate terminals of the transistors, respectively, and a number of MDs (e.g., 822, 824 and 826) can be formed to couple to source/drain terminals of the CG transistors 250 and 260. Further, a number of back-end interconnect structures can be formed over the middle-end interconnect structures. Such back-end interconnect structures include the above mentioned M0 tracks (e.g., 832, 834, 836, 838) in M0 layer, and other metal tracks (e.g., 852, 854, 872, 874, 876, 878) in upper metallization layers (e.g., M1, M2, M3, M4). Through at least the VGs, each of the WL transistors 250 and 260 can be gated. For example, the WL transistors 250 and 260 can be commonly gated to $WL_1$ as shown in FIG. 8B.

The frontside interconnect structure can be formed of a metal material. The metal material can be selected from the group consisting of aluminum, tungsten, tungsten nitride, copper, cobalt, silver, gold, chrome, ruthenium, platinum, titanium, titanium nitride, tantalum, tantalum nitride, nickel, hafnium, and combinations thereof. Other metal materials are within the scope of the present disclosure. The frontside interconnect structures can be formed by overlaying the frontside of the substrate with the above-listed metal material by, for example, chemical vapor deposition (CVD), physical vapor deposition (PVD), electroless plating, electroplating, or combinations thereof.

The method 1000 proceeds to operation 1016 in which a first CG transistor and a second CG transistor are formed in a first one of the plurality of metallization layers in the BEOL network over the first WL transistor and the second WL transistor. Similarly, at least some of the above-mentioned processes used to form the WL transistors can be used to form the CG transistors. Referring to e.g., FIG. 8D, in the memory device 800D, the first CG transistor 230 and the second CG transistor 240 are formed in a metallization layer M2 in the BEOL network over the first WL transistor 250 and the second WL transistor 260, which are formed in the FEOL network. Through the frontside interconnect structures, the first and the second CG transistors 230 and 240 are respectively gated. And through the frontside interconnect structures, the first and the second CG transistors 230 and 240 are respectively connected to the first and the second WL transistors 250 and 260 in series.

The method 1000 proceeds to operation 1018 in which a first fuse resistor and a second fuse resistor are formed in a second one of the plurality of metallization layers in the BEOL network over the first WL transistor and the second WL transistor. Referring to FIG. 8D, a first and a second fuse resistors 210 and 220 in the memory device 800D are formed in a metallization layer M3. Through the frontside interconnect structures, the first fuse resistor 210 and the second fuse resistor 220 are commonly connected to a bit line $BL_0$. Through the interconnect structures, the first fuse resistor 210 is connected between the first CG transistor 230 and the $BL_0$, and the second fuse resistor 220 is connected between the second CG transistor 240 and the $BL_0$. As shown in FIG. 8D, M4 metal track 862 can be implemented to be part of the bit line $BL_0$.

The method 1000 proceeds to operation 1020 in which a number of backside interconnect structures are formed in accordance with various embodiments. Upon forming the back-end metal tracks, the substrate is flipped, and a number of backside interconnect structures (e.g., BM0 track) are formed over the backside of the substrate. For example, after the substrate is flipped, a polishing process may be performed on the backside of the substrate until a bottom surface of the epitaxial structures (e.g., the source/drain terminals formed in operation 1010) is exposed. Next, one or more dielectric layers are formed over the polished backside surface, followed by forming the backside via structures that can each extend through the one or more dielectric layers to reach the bottom surface of a corresponding epitaxial structure. Next, the backside interconnect structures can be formed in respective backside metallization layers.

The backside interconnect structure is formed of a metal material. The metal material can be selected from the group consisting of aluminum, tungsten, tungsten nitride, copper, cobalt, silver, gold, chrome, ruthenium, platinum, titanium, titanium nitride, tantalum, tantalum nitride, nickel, hafnium, and combinations thereof. Other metal materials are within the scope of the present disclosure. The backside interconnect structures can be formed by overlaying the backside of the substrate with the above-listed metal material by, for example, chemical vapor deposition (CVD), physical vapor deposition (PVD), electroless plating, electroplating, or combinations thereof.

FIG. 11 illustrates an example diagram of a thin film transistor 1100 in accordance with some embodiments. In some embodiments, the thin film transistor 1100 as shown in FIG. 11 can be implemented as the CG transistors 230 and 240 as shown in FIGS. 8A-9C. As shown in FIG. 11, the thin film transistor 1100 includes a bottom gate 1116, a gate dielectric 1118 disposed over the bottom gate 1116, a channel structure 1120 disposed over the gate dielectric 1118, and a pair of source/drain structures 1122 and 1124 disposed over the channel structure 1120. The thin film transistor 1100 can be referred to as a "two-dimensional back-gate transistor" or "2D transistor." The term "two-dimensional back-gate transistor" may refer to a transistor having its gate formed as a relatively planar or thinner structure and its channel structure contacting a top surface of its gate. In some embodiments, the bottom gate 1116 includes TiN, the gate dielectric 1118 includes a high-K dielectric material (such as $HfO_2$), the channel structure 1120 includes InGaZnO (IGZO), and the source/drain structures 1122 and 1124 includes TiN.

In one aspect of the present disclosure, a memory device is disclosed. The memory device includes an array having a plurality of one-time-programmable (OTP) memory cells on one side of a substrate, a plurality of word lines (WLs), a plurality of bit lines (BLs), and a plurality of control gate (CG) lines. Each of the OTP memory cells includes a first fuse resistor, a second fuse resistor, a first transistor, and a second transistor. The first and the second fuse resistors are connected to a corresponding one of the BLs, while the first and the second transistors are respectively gated by a first one and a second one of the CG lines. The first transistor, the second transistor, the first fuse resistor, and the second fuse resistor are respectively formed in a first one, a second one, a third one, and a fourth one of a plurality of metallization layers disposed on the side of the substrate.

In another aspect of the present disclosure, a memory device is disclosed. The memory device includes a memory cell that is on one side of a substrate. The memory cell includes a first fuse resistor, a second fuse resistor, a first transistor connected to the first fuse resistor in series, and a second transistor connected to the second fuse resistor in series. The memory cell is configured to randomly present a first logic state when the first fuse resistor is blown, or a second logic state when the second fuse resistor is blown. The first transistor, the second transistor, the first fuse resistor, and the second fuse resistor are formed in a first one, a second one, a third one, and a fourth one of a plurality of metallization layers disposed on the side of the substrate, respectively.

In yet another aspect of the present disclosure, a method for fabricating a memory devices is disclosed. The method includes forming a first and a second word line transistors along a major surface on a side of a substrate; forming a first one of a plurality of metallization layers disposed over the first and the second word line transistors; forming a second one of the plurality of metallization layers over the first one of the plurality of metallization layers; forming a first and a second control gate transistors in the second one of the plurality of metallization layers; forming a third one of the plurality of metallization layers over the first one of the plurality of metallization layers; and forming a first and a second fuse resistors in the third one of the plurality of metallization layers. The first and the second word line transistors are commonly gated and commonly connected to a power rail. The first and the second control gate transistors are respectively gated. The first fuse resistor is connected between the first control gate transistor and a bit line, and the second fuse resistor is connected between the second control gate transistor and the bit line.

As used herein, the terms "about" and "approximately" generally indicates the value of a given quantity that can vary based on a particular technology node associated with the subject semiconductor device. Based on the particular technology node, the term "about" can indicate a value of a given quantity that varies within, for example, 10-30% of the value (e.g., +10%, ±20%, or ±30% of the value).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
an array comprising a plurality of one-time-programmable (OTP) memory cells on one side of a substrate;
a plurality of word lines (WLs); a plurality of bit lines (BLs); and
a plurality of control gate (CG) lines;
wherein each of the OTP memory cells comprises a first fuse resistor, a second fuse resistor, a first transistor, and a second transistor,
wherein the first fuse resistor and the second fuse resistor are connected to a corresponding one of the BLs, while the first transistor and the second transistor are gated by a first one and a second one of the CG lines, respectively, and
wherein the first transistor, the second transistor, the first fuse resistor, and the second fuse resistor are formed in a first one, a second one, a third one, and a fourth one of a plurality of metallization layers disposed on the side of the substrate, respectively.

2. The memory device of claim 1, wherein the first one, the second one, the third one, and the fourth one of the plurality of metallization layers are on the one side of the side of the substrate, and wherein the first one and the second one of the plurality of metallization layers are formed of the same materials and made in identical dimensions to each other.

3. The memory device of claim 2, wherein the first one and the second one of the plurality of metallization layers are different from the third one and the fourth one of the plurality of metallization layers.

4. The memory device of claim 1, wherein the OTP memory cells are arranged in a plurality of columns and a plurality of rows, each of the rows including a corresponding one of the WLs, and each of the columns including a corresponding one of the BLs and a corresponding pair of the CG lines.

5. The memory device of claim 1, wherein each of the OTP memory cells further comprises a third transistor and a fourth transistor on a surface comprising an active region of the side of the substrate, and wherein the third and fourth transistors are commonly gated by a corresponding one of the WLs.

6. The memory device of claim 5, wherein the first fuse resistor, the first transistor, and the third transistor are connected in series between the corresponding BL and a power rail that carries a supply voltage, and wherein the second fuse resistor, the second transistor, and the fourth transistor are connected in series between the corresponding BL and the power rail.

7. The memory device of claim 1, wherein each of the OTP memory cells further comprises a third transistor on a surface comprising an active region of the side of the substrate, and wherein the third transistor is gated by a corresponding one of the WLs.

8. The memory device of claim 7, wherein the first fuse resistor, the first transistor, and the third transistor are connected in series between the corresponding BL and a power rail that carries a supply voltage, and wherein the second fuse resistor, the second transistor, and the third transistor are connected in series between the corresponding BL and the power rail.

9. The memory device of claim 1, wherein each of the OTP memory cells is configured to permanently present a logic state based on whether the first fuse resistor or the second fuse resistor is randomly blown.

10. The memory device of claim 9, wherein the logic state is identified based on activating one of the first transistor or the second transistor.

11. A memory device, comprising:
a memory cell that is on one side of a side of a substrate and comprises:
a first fuse resistor;
a second fuse resistor;
a first transistor connected to the first fuse resistor in series; and
a second transistor connected to the second fuse resistor in series,
wherein the memory cell is configured to randomly present a first logic state when the first fuse resistor is blown, or a second logic state when the second fuse resistor is blown, and
wherein the first transistor, the second transistor, the first fuse resistor, and the second fuse resistor are formed in a first one, a second one, a third one, and a fourth one of a plurality of metallization layers disposed on the side of the substrate, respectively.

12. The memory device of claim 11, wherein the first one, the second one, the third one, and the fourth one of the plurality of metallization layers are on the side of the substrate, wherein the first one and the second one of the plurality of metallization layers are formed of the same materials and made in identical dimensions to each other, and wherein either the first logic state or the second logic state functions as a bit of a Physically Unclonable Function (PUF) signature for the memory cell.

13. The memory device of claim 11, wherein the memory cell further comprises:
a third transistor connected to the first transistor in series; and
a fourth transistor connected to the second transistor in series, wherein the third transistor and the fourth transistor are on a surface comprising an active region of the side of the substrate.

14. The memory device of claim 13, wherein the third and fourth transistors are concurrently activated and the first and second transistors are concurrently activated, when programming the memory cell to randomly blow the first fuse resistor or the second fuse resistor.

15. The memory device of claim 13, wherein the third and fourth transistors are concurrently activated and only one of the first or second transistors is activated, when reading the memory cell to identify the first or second logic state.

16. The memory device of claim 11, wherein the memory cell further comprises:
a third transistor connected to each of the first transistor and the second transistor in series, wherein the third transistor is on a surface comprising an active region of the side of the substrate.

17. The memory device of claim 16, wherein the third transistor is activated and the first and second transistors are concurrently activated, when programming the memory cell to randomly blow the first fuse resistor or the second fuse resistor.

18. The memory device of claim 16, wherein the third transistor is activated and only one of the first or second transistors is activated, when reading the memory cell to identify the first or second logic state.

19. A method for fabricating a semiconductor device, comprising:
forming a first and a second word line transistors along a surface comprising an active region on a side of a substrate;
forming a first one of a plurality of metallization layers disposed over the first and the second word line transistors, wherein the first and the second word line transistors are commonly gated and commonly connected to a power rail;
forming a second one of the plurality of metallization layers over the first one of the plurality of metallization layers;
forming a first and a second control gate transistors in the second one of the plurality of metallization layers, wherein the first and the second control gate transistors are respectively gated;
forming a third one of the plurality of metallization layers over the first one of the plurality of metallization layers; and
forming a first and a second fuse resistors in the third one of the plurality of metallization layers, wherein the first fuse resistor is connected between the first control gate transistor and a bit line, and wherein the second fuse resistor is connected between the second control gate transistor and the bit line.

20. The method of claim 19, wherein the second one of the plurality of metallization layers is between the substrate and the third one of the plurality of metallization layers.

* * * * *